(12) United States Patent
Chang et al.

(10) Patent No.: US 10,797,041 B2
(45) Date of Patent: Oct. 6, 2020

(54) INTEGRATED CIRCUIT, SYSTEM FOR AND METHOD OF FORMING AN INTEGRATED CIRCUIT

(71) Applicant: TAIWAN SEMICONDUCTOR MANUFACTURING COMPANY, LTD., Hsinchu (TW)

(72) Inventors: Fong-Yuan Chang, Hsinchu (TW); Jyun-Hao Chang, Hsinchu (TW); Sheng-Hsiung Chen, Hsinchu (TW); Po-Hsiang Huang, Tainan (TW); Lipen Yuan, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 125 days.

(21) Appl. No.: 16/205,014

(22) Filed: Nov. 29, 2018

(65) Prior Publication Data

US 2019/0096872 A1 Mar. 28, 2019

Related U.S. Application Data

(62) Division of application No. 15/465,167, filed on Mar. 21, 2017, now Pat. No. 10,262,981.

(Continued)

(51) Int. Cl.
*H01L 27/02* (2006.01)
*G06F 30/392* (2020.01)
(Continued)

(52) U.S. Cl.
CPC ........ *H01L 27/0207* (2013.01); *G06F 30/392* (2020.01); *G06F 30/394* (2020.01);
(Continued)

(58) Field of Classification Search
CPC ... H01L 27/0207; G06F 30/39; G06F 30/392; G06F 30/394
(Continued)

(56) References Cited

U.S. PATENT DOCUMENTS 8,421,205 B2 4/2013 Yang
8,661,389 B2 2/2014 Chern et al.
(Continued)

FOREIGN PATENT DOCUMENTS

CN 103186692 7/2013
TW 201001677 1/2010

OTHER PUBLICATIONS

Office Action dated Jul. 6, 2018 from corresponding application No. TW 106114141.

*Primary Examiner* — Paul Dinh
(74) *Attorney, Agent, or Firm* — Hauptman Ham, LLP

(57) ABSTRACT

An integrated circuit includes a first region and a first conductive structure in the first region, wherein the first conductive structure extends in a first direction. The integrated circuit further includes a first via coupled to the first conductive structure. The integrated circuit further includes a second region adjacent to the first region. The integrated circuit further includes a power structure configured to supply a voltage to the first or second region. The power structure includes a second conductive structure extending in the first direction and overlapping a boundary between the first region and the second region. The first conductive structure and the second conductive structure are aligned in a second direction. The first conductive structure and the second conductive structure are separated from each other in the first direction by a distance greater than a minimum spacing requirement of the first conductive structure and the second conductive structure.

20 Claims, 14 Drawing Sheets

Related U.S. Application Data

(60) Provisional application No. 62/329,966, filed on Apr. 29, 2016.

(51) Int. Cl.
*G06F 30/394* (2020.01)
*H01L 23/522* (2006.01)
*H01L 23/528* (2006.01)
*H01L 27/118* (2006.01)

(52) U.S. Cl.
CPC ...... *H01L 23/5226* (2013.01); *H01L 23/5286* (2013.01); *H01L 2027/11875* (2013.01)

(58) Field of Classification Search
USPC .......................................... 716/110, 119, 122
See application file for complete search history.

(56) References Cited

U.S. PATENT DOCUMENTS

| | | | |
|---|---|---|---|
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 2006/0123373 A1* | 6/2006 | Andreev | G06F 30/392 716/122 |
| 2008/0042284 A1 | 2/2008 | Naruse et al. | |
| 2011/0272782 A1* | 11/2011 | Yang | G06F 30/392 257/532 |
| 2012/0223368 A1 | 9/2012 | Sherlekar et al. | |
| 2012/0292714 A1 | 11/2012 | Omura | |
| 2013/0126978 A1 | 5/2013 | Becker et al. | |
| 2013/0174106 A1 | 7/2013 | Hsu et al. | |
| 2013/0313615 A1 | 11/2013 | Tzeng et al. | |
| 2014/0264924 A1 | 9/2014 | Yu et al. | |
| 2014/0282289 A1 | 9/2014 | Hsu et al. | |
| 2015/0279453 A1 | 10/2015 | Fujiwara et al. | |
| 2015/0286768 A1* | 10/2015 | Macdonald | G06F 30/394 257/773 |
| 2015/0318241 A1 | 11/2015 | Chang et al. | |
| 2015/0347659 A1 | 12/2015 | Chiang et al. | |
| 2015/0357279 A1 | 12/2015 | Fujiwara et al. | |
| 2016/0012169 A1 | 1/2016 | Chiang et al. | |
| 2018/0218981 A1* | 8/2018 | Lin | G06F 30/394 |

* cited by examiner

INTEGRATED CIRCUIT, SYSTEM FOR AND METHOD OF FORMING AN INTEGRATED CIRCUIT

PRIORITY CLAIM

The present application is a divisional of U.S. application Ser. No. 15/465,167, filed Mar. 21, 2017, which claims the priority of U.S. Provisional Application No. 62/329,966, filed Apr. 29, 2016, which are incorporated herein by reference in their entireties.

BACKGROUND

The recent trend in miniaturizing integrated circuits has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify designs for integrated circuits while ensuring that the design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
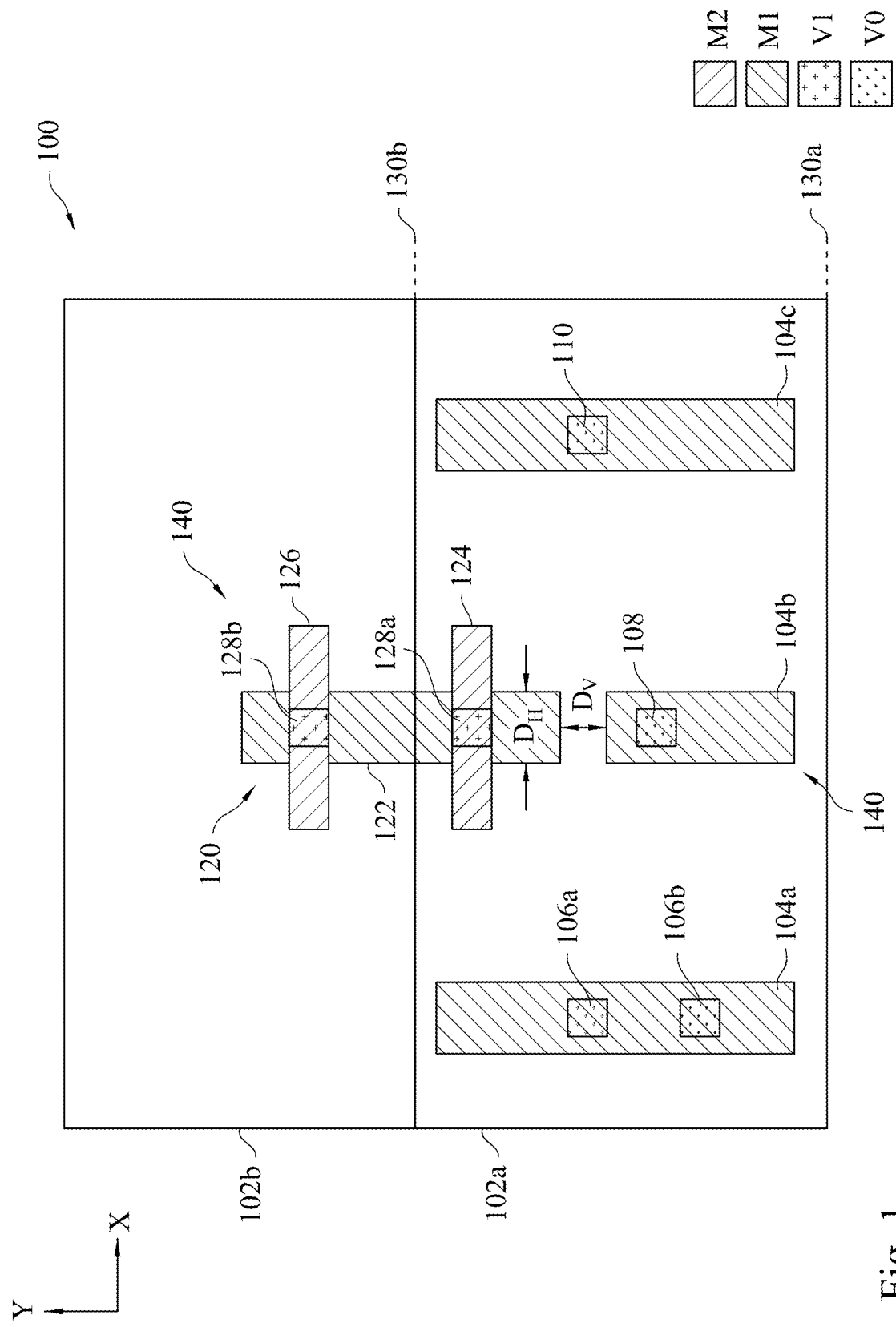
FIG. 1 is a top view of a portion of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of forming an integrated circuit includes generating a layout design of the integrated circuit, manufacturing the integrated circuit based on the layout design, and removing a portion of a conductive structure of the integrated circuit thereby forming a first conductive structure and a second conductive structure.

In accordance with some embodiments, a location of the removed portion of the conductive structure is identified by a cut feature layout pattern. In accordance with some embodiments, the cut feature layout pattern is part of a power layout pattern of a power structure.

In accordance with some embodiments, the method of forming the layout design of the integrated circuit includes generating a standard cell layout having a set of conductive feature layout patterns, placing a power layout pattern with the standard cell layout according to at least one design criterion, and extending at least one conductive feature layout pattern of the set of conductive feature layout patterns in at least one direction to a boundary of the power layout pattern.

FIG. 1 is a top view of a portion of an integrated circuit, in accordance with some embodiments.

Integrated circuit 100 includes a first region 102a, a second region 102b and a power structure 120.

First region 102a has boundaries 130a and 130b extending along a first direction X. Boundary 130b is shared with first region 102a and second region 102b. First region 102a is located directly next to or adjacent to second region 102b.

In some embodiments, first region 102a is separated from the second region 102b by one or more other regions (not shown). First region 102a includes a first conductive structure 104a electrically coupled with a first via 106a and a second via 106b, a second conductive structure 104b electrically coupled with a third via 108, and a third conductive structure 104c electrically coupled with a fourth via 110. A different number of regions, power structures, conductive structures or vias is within the contemplated scope of the present disclosure.

In some embodiments, first region 102a or second region 102b is a standard cell. In some embodiments, a standard cell is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM), read only memory (ROM), or the like. In some embodiments, a standard cell includes one or more active or passive elements. Examples of active elements include, but are not limited to, transistors, diodes, or the like. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors or the like. In some embodiments, first region 102a or second region 102b includes other features not shown for ease of illustration.

First conductive structure 104a is configured to electrically couple first via 106a and second via 106b. First conductive structure 104a is over the first region 102a, and extends in a second direction Y. Second direction Y differs from first direction X. In some embodiments, second direction Y is perpendicular to first direction X. First conductive structure 104a extends within the boundaries of the first region 102a. In some embodiments, first conductive structure 104a extends outside of the first region 102a. In some embodiments, first conductive structure 104a is located on a first metal layer M1 of integrated circuit 100. In some embodiments, first conductive structure 104a is located on a same layer (e.g., M1) as second conductive structure 104b or third conductive structure 104c. First conductive structure 104a is parallel to second conductive structure 104b, third conductive structure 104c or a fourth conductive structure 122. In some embodiments, first conductive structure 104a is not parallel to second conductive structure 104b, third conductive structure 104c or fourth conductive structure 122.

First via 106a or second via 106b is configured to electrically couple first conductive structure 104a to elements/features (not shown) in first region 102a. First via 106a and second via 106b are over the first region 102a. First via 106a and second via 106b are below the first conductive structure 104a.

Second conductive structure 104b is electrically coupled to the third via 108. Second conductive structure 104b is over the first region 102a, and extends in the second direction Y. Second conductive structure 104b extends within the boundaries of the first region 102a. In some embodiments, second conductive structure 104b extends outside of the first region 102a. In some embodiments, second conductive structure 104b is located on the first metal layer M1 of integrated circuit 100. In some embodiments, second conductive structure 104b is located on the same layer (e.g., M1) as first conductive structure 104a or third conductive structure 104c. Second conductive structure is parallel to first conductive structure 104a or third conductive structure 104c. In some embodiments, second conductive structure 104b is not parallel to first conductive structure 104a or third conductive structure 104c.

Third via 108 is configured to electrically couple second conductive structure 104b to elements/features (not shown) in first region 102a. Third via 108 is over the first region 102a, and below the second conductive structure 104b.

Third conductive structure 104c is electrically coupled to the fourth via 110. Third conductive structure 104c is over the first region 102a, and extends in the second direction Y. Third conductive structure 104c extends within the boundaries of the first region 102a. In some embodiments, third conductive structure 104c extends outside of the first region 102a. In some embodiments, third conductive structure 104c is located on the first metal layer M1 of integrated circuit 100. In some embodiments, third conductive structure 104c is located on the same layer (e.g., M1) as first conductive structure 104a or second conductive structure 104b. Third conductive structure 104c is parallel to first conductive structure 104a or second conductive structure 104b. In some embodiments, third conductive structure 104c is not parallel to first conductive structure 104a or second conductive structure 104b.

Fourth via 110 is configured to electrically couple third conductive structure 104c to elements/features (not shown) in first region 102a. Fourth via 110 is over the first region 102a, and below the second conductive structure 104b.

In some embodiments, one or more of first conductive structure 104a, second conductive structure 104b or third conductive structure 104c is a conductive material including copper, aluminum, nickel, titanium, tungsten, cobalt, carbon, alloys thereof or another suitable conductive material.

Power structure 120 is configured to provide a first supply voltage VDD or a second supply voltage VSS to the first region 102a or the second region 102b.

Power structure 120 is over the first region 102a and the second region 102b. Power structure 120 extends across the cell boundary 130b. Power structure 120 is in the first region 102a and the second region 102b. In some embodiments, at least a portion of power structure 120 is outside of the first region 102a and the second region 102b. In some embodiments, power structure 120 is completely inside either the first region 102a or the second region 102b. Power structure 120 includes a fourth conductive structure 122, a fifth conductive structure 124, a sixth conductive structure 126, a fifth via 128a and a sixth via 128b.

Figure 2A:
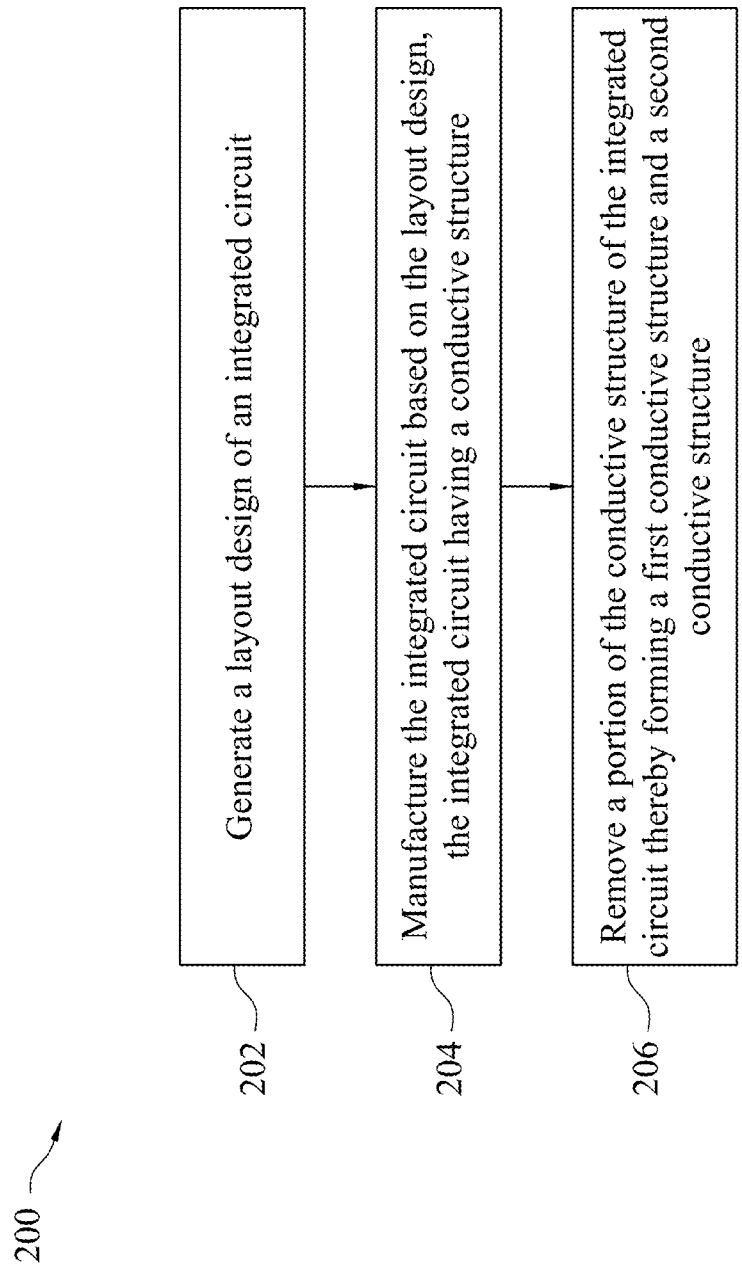
FIG. 2A is a flowchart of a method of forming an integrated circuit, in accordance with some embodiments.

Fourth conductive structure 122 is configured to provide the first supply voltage VDD or the second supply voltage VSS to the first region 102a or the second region 102b. Fourth conductive structure 122 is over the first region 102a and the second region 102b. Fourth conductive structure 122 extends in the second direction Y and across the cell boundary 130b. In some embodiments, fourth conductive structure 122 extends outside of the first region 102a and second region 102b. Fourth conductive structure 122 is inside the first region 102a and the second region 102b. In some embodiments, fourth conductive structure 122 is located on the first metal layer M1 of integrated circuit 100. In some embodiments, fourth conductive structure 122 is located on the same layer (e.g., M1) as first conductive structure 104a, second conductive structure 104b or third conductive structure 104c. Fourth conductive structure 104d is parallel to first conductive structure 104a, second conductive structure 104b or third conductive structure 104c. In some embodiments, fourth conductive structure 104d is not parallel to first conductive structure 104a, second conductive structure 104b or third conductive structure 104c. Fourth conductive structure 122 is separated from second conductive structure 104b in the second direction Y by a first distance $D_V$. In some embodiments, fourth conductive structure 122 and second conductive structure 104b are coupled to each other as a single conductive feature (referred to herein as "conductive structure 140") on the same metal layer prior to operation 206 in method 200 (FIG. 2A).

Fifth conductive structure 124 is configured to provide the first supply voltage VDD or the second supply voltage VSS to the first region 102a. Fifth conductive structure 124 is electrically coupled to the fourth conductive structure 122 by a fifth via 128a. Fifth conductive structure 124 is over and inside the first region 102a. Fifth conductive structure 124 extends in the first direction X and overlaps fourth conductive structure 122. Fifth conductive structure 124 is perpendicular to fourth conductive structure 122. In some embodiments, fifth conductive structure 124 is not perpendicular to fourth conductive structure 122. In some embodiments, fifth conductive structure 124 extends outside of the first region 102a. In some embodiments, fifth conductive structure 124 is located on a second metal layer M2 of integrated circuit 100. In some embodiments, fifth conductive structure 124 is located on the same layer (e.g., M2) as sixth conductive structure 126.

Sixth conductive structure 126 is configured to provide the first supply voltage VDD or the second supply voltage VSS to the second region 102b. Sixth conductive structure 126 is electrically coupled to the fourth conductive structure 122 by a sixth via 128b. Sixth conductive structure 126 is over and inside the second region 102b. Sixth conductive structure 126 extends in the first direction X and overlaps fourth conductive structure 122. Sixth conductive structure 126 is perpendicular to fourth conductive structure 122. In some embodiments, sixth conductive structure 126 is not perpendicular to fourth conductive structure 122. Sixth conductive structure 126 is parallel to fifth conductive structure 124. In some embodiments, sixth conductive structure 126 is not parallel to fifth conductive structure 124. In some embodiments, sixth conductive structure 126 extends outside of the second region 102b. In some embodiments, sixth conductive structure 126 is located on the second metal layer M2 of integrated circuit 100. In some embodiments, one or more of fourth conductive structure 122, fifth conductive structure 124 or sixth conductive structure 126 is a conductive material including copper, aluminum, nickel, titanium, tungsten, cobalt, carbon, alloys thereof or another suitable conductive material.

Fifth via 128a is configured to electrically couple fourth conductive structure 122 to fifth conductive structure 124. Fifth via 128a is over the first region 102a and fourth conductive structure 122. Fifth via 128a is below fifth conductive structure 124.

Sixth via 128b is configured to electrically couple fourth conductive structure 122 to sixth conductive structure 126. Sixth via 128b is over the second region 102b and fourth conductive structure 122. Sixth via 128b is below sixth conductive structure 126.

In some embodiments, at least one of first via 106a, second via 106b, third via 108, fourth via 110, fifth via 128a or sixth via 128b is a metal line, a through silicon via (TSV), an inter-level via (ILV), a square via, a slot via, an array of vias, or another suitable conductive line. In some embodiments, at least one of first via 106a, second via 106b, third via 108, fourth via 110, fifth via 128a or sixth via 128b includes copper, aluminum, nickel, titanium, tungsten, cobalt, carbon, alloys thereof or another suitable conductive material. In some embodiments, at least one of first via 106a, second via 106b, third via 108, fourth via 110, fifth via 128a or sixth via 128b includes one or more conductive line portions. In some embodiments, a slot via has a length different from a width. In some embodiments, a square via has a same length as a width.

In some embodiments, first conductive structure 104a, second conductive structure 104b or third conductive structure 104c is a pin. In some embodiments, fourth conductive structure 122, fifth conductive structure 124 or sixth conductive structure 126 is a pin. In some embodiments, first region 102a or second region 102b includes one or more pins not shown for simplicity.

FIG. 2A is a flowchart of a method 200 of forming an integrated circuit in accordance with some embodiments. It is understood that additional operations may be performed before, during, and/or after the method 200 depicted in FIG. 2A, and that some other processes may only be briefly described herein. In some embodiments, the method 200 is usable to form integrated circuits, such as integrated circuit 100 (FIG. 1).

In operation 202 of method 200, a layout design 500 (FIG. 5A) of an integrated circuit 100 is generated. Operation 202 is performed by a processing device (e.g., processor 1202 (FIG. 12)) configured to execute instructions for generating a layout design (e.g., layout design 500). In some embodiments, the layout design 500 is a graphic database system (GDSII) file format.

Figure 5A:
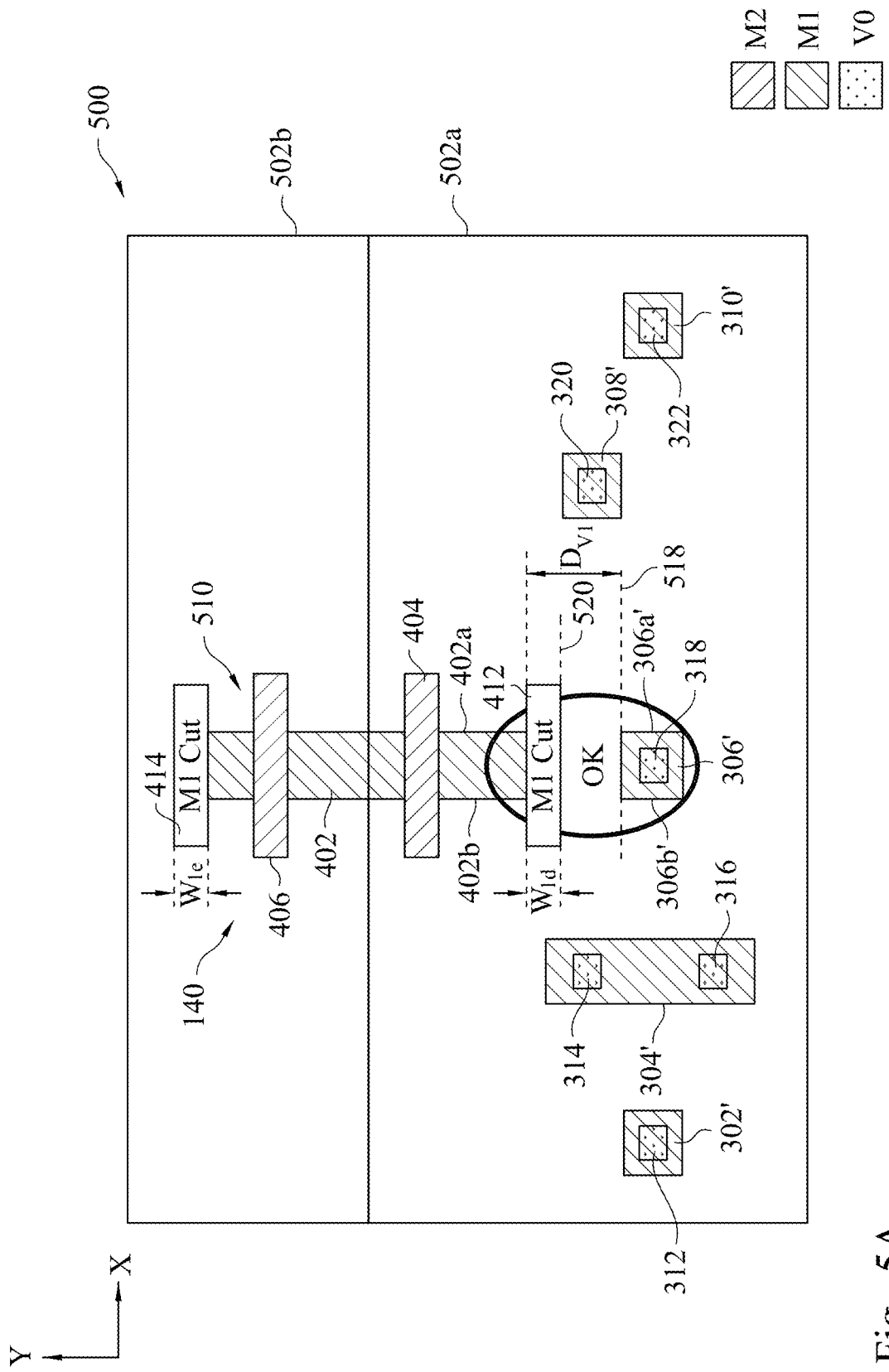
FIG. 5A is a diagram of a portion of a layout design of an integrated circuit, in accordance with some embodiments.

Method 200 continues with operation 204, where the integrated circuit 100 (FIG. 1) is manufactured based on the layout design 500 (FIG. 5A). In some embodiments, the integrated circuit 100 (FIG. 1) includes conductive structure 140. In some embodiments, the conductive structure 140 is located on first metal layer M1 or second metal layer M2 of integrated circuit 100. In some embodiments, operation 204 comprises manufacturing at least one mask based on the layout design 500 (FIG. 5A), and manufacturing the integrated circuit 100 (FIG. 1) based on the at least one mask.

Method 200 continues with operation 206, where a portion of the conductive structure 140 is removed thereby forming a first conductive structure (e.g., second conductive structure 104b) and a second conductive structure (e.g., fourth conductive structure 122). In some embodiments, the removed portion of the conductive structure 140 corresponds to a cut region (e.g., cut feature layout pattern 412 (FIG. 4)). In some embodiments, operation 206 of method 200 is referred to as a cut-metal process.

Figure 4:
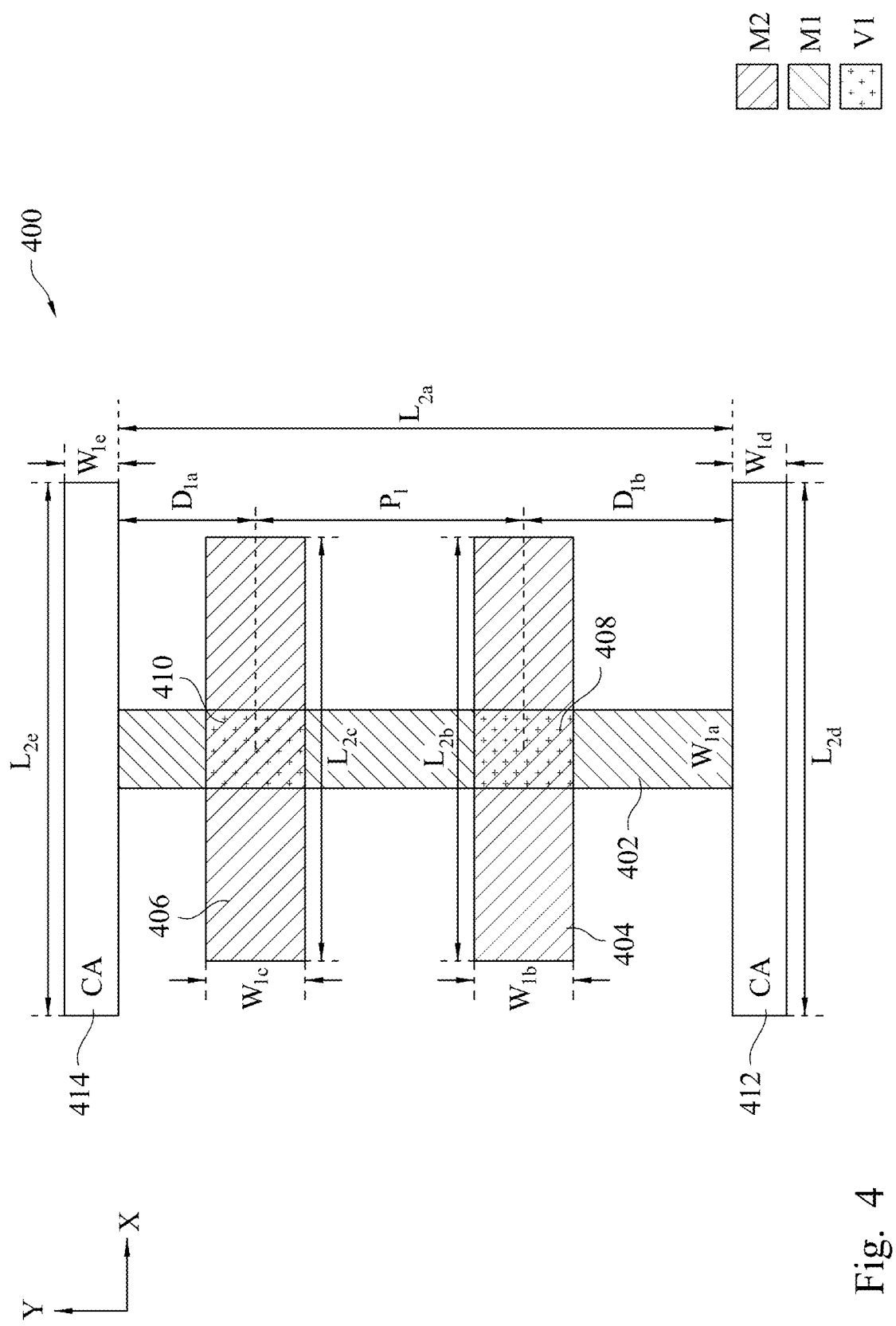
FIG. 4 is a diagram of a portion of a layout design usable to manufacture the power structure of FIG. 1, in accordance with some embodiments.
Figure 5B:
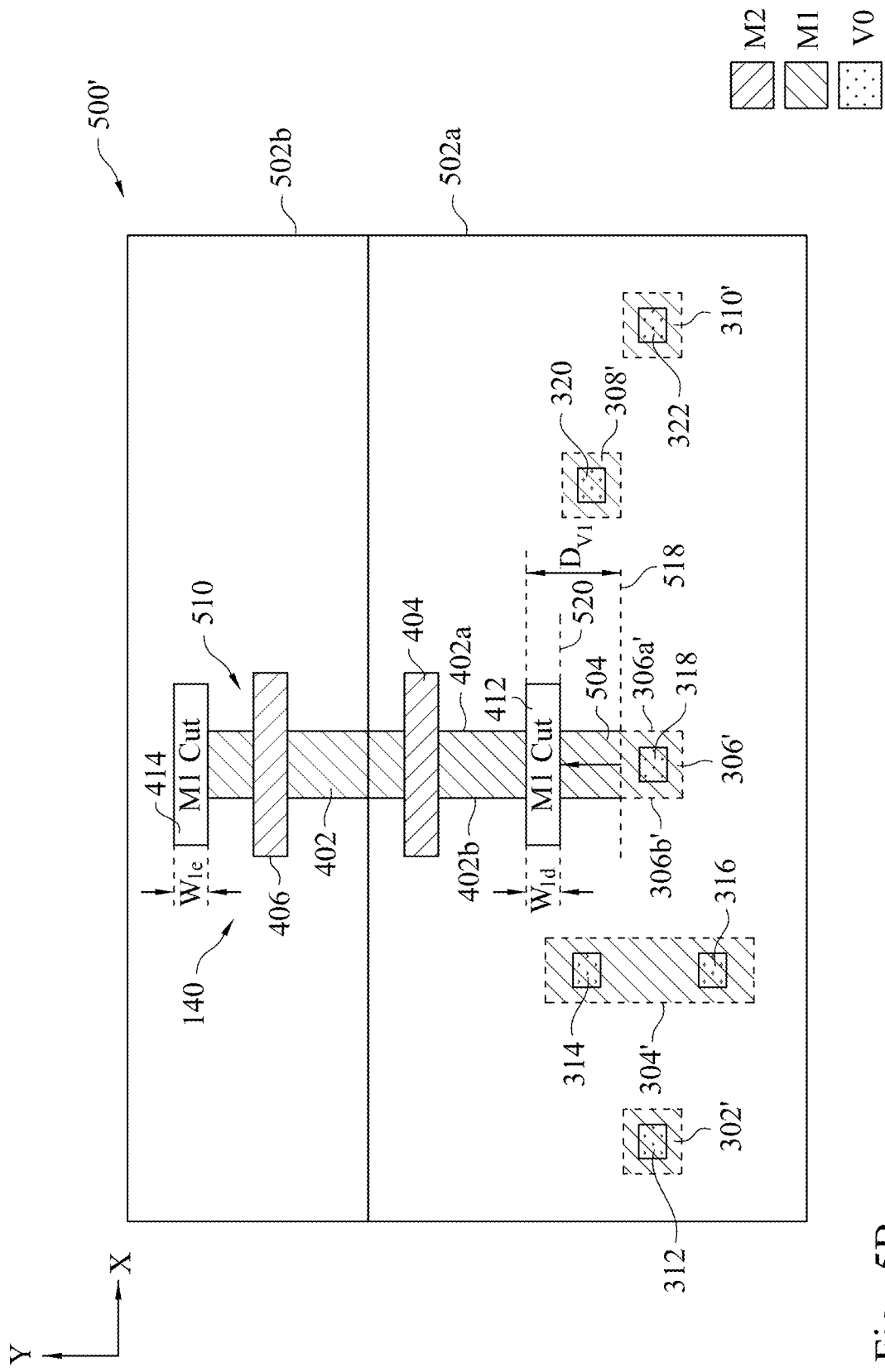
FIG. 5B is a diagram of a portion of a layout design of an integrated circuit, in accordance with some embodiments.

In some embodiments, the portion of the conductive structure 140 that is removed in operation 206 is identified in layout designs 400 and 500-500' by cut feature layout pattern 412 (FIGS. 4, 5A-5B). In some embodiments, the cut feature layout pattern 412 identifies a location of the removed portion of the conductive structure 140 of the integrated circuit 100.

In some embodiments, the removed portion of the conductive structure 140 comprises cut width $D_V$ (FIG. 1) in second direction Y, and cut length $D_H$ (FIG. 1) in first direction X. In some embodiments, the cut feature layout pattern 412 (FIG. 4) comprises a pattern width $W_{1d}$ in the second direction Y, and a pattern length $L_{2d}$ in the first direction X. In some embodiments, the pattern width $W_{1d}$ corresponds to the cut width $D_V$, the pattern length $L_{2d}$ corresponds to the cut length $D_H$. In some embodiments, operation 206 of method 200 is performed on conductive structures in integrated circuit 100 that are not sufficiently separated from each other in the second direction Y to ensure a consistent manufactured yield. For example, in these embodiments, if the distance $D_V$ between fourth conductive structure 122 and second conductive structure 104b in the second direction Y is less than a minimum distance (e.g., dependent upon manufacturing process), then fourth conductive structure 122 and second conductive structure 104b are not sufficiently separated from each other to ensure a consistent manufactured yield, and therefore operation 206 of method 200 is applied to conductive structure 140 to form fourth conductive structure 122 and second conductive structure 104b to ensure sufficient separation. In some embodiments, if the distance $D_V$ between fourth conductive structure 122 and second conductive structure 104b in the second direction Y is less than a minimum distance (e.g., dependent upon manufacturing process), then operation 206 of method 200 is not performed (e.g., optional) on conductive structure 140 to form fourth conductive structure 122 and second conductive structure 104b. The minimum distance is the minimum spacing between conductive structures manufactured to ensure a consistent yield. In some embodiments, the area of the cut feature layout pattern (e.g., cut feature layout pattern 412, 414, 604, 610, 612, 1002, 1004, 1006 or 1008) is less than or equal to an area of the removed portion of the conductive structure 140 of the integrated circuit 100. In some embodiments, the area of the removed portion of the conductive structure 140 of the integrated circuit 100 is based upon the cut width $D_V$ and the cut length $D_H$. In some embodiments, the area of the cut feature layout pattern (e.g., cut feature layout pattern 412, 414, 604, 610, 612, 1002, 1004, 1006 or 1008) is greater than the area of the removed portion of the conductive structure 140 of the integrated circuit 100.

In some embodiments, operation 206 is performed by a removal process. In some embodiments, the removal process includes one or more etching processes suitable to remove a portion of conductive structure 140. In some embodiments, the etching process of operation 206 includes identifying a portion of the conductive structure 140 that is to be removed, and etching the portion of the conductive structure 140 that is to be removed. In some embodiments, a mask is used to specify portions of the conductive structure 140 that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like.

The description of method 200 is a basis to be modified and applies to other features described herein. In some embodiments, method 200 is utilized with layout patterns other than layout pattern 500. For example, in some embodiments, layout design 500 of operations 202 and 204 is replaced with one or more of layout design 300 (FIG. 3A), layout design 300' (FIG. 3B), layout design 400 (FIG. 4), layout design 500' (FIG. 5B), layout design 600 (FIG. 6), layout design 700 (FIG. 7), layout design 800 (FIG. 8), layout design 900 (FIG. 9), layout design 1000 (FIG. 10) or layout design 1100 (FIG. 11). In some embodiments, method 200 is utilized with conductive structures other than conductive structure 140. For example, in some embodiments, conductive structure 140 of operations 204 or 206 is replaced with conductive structure 104a or 104c.

Figure 2B:
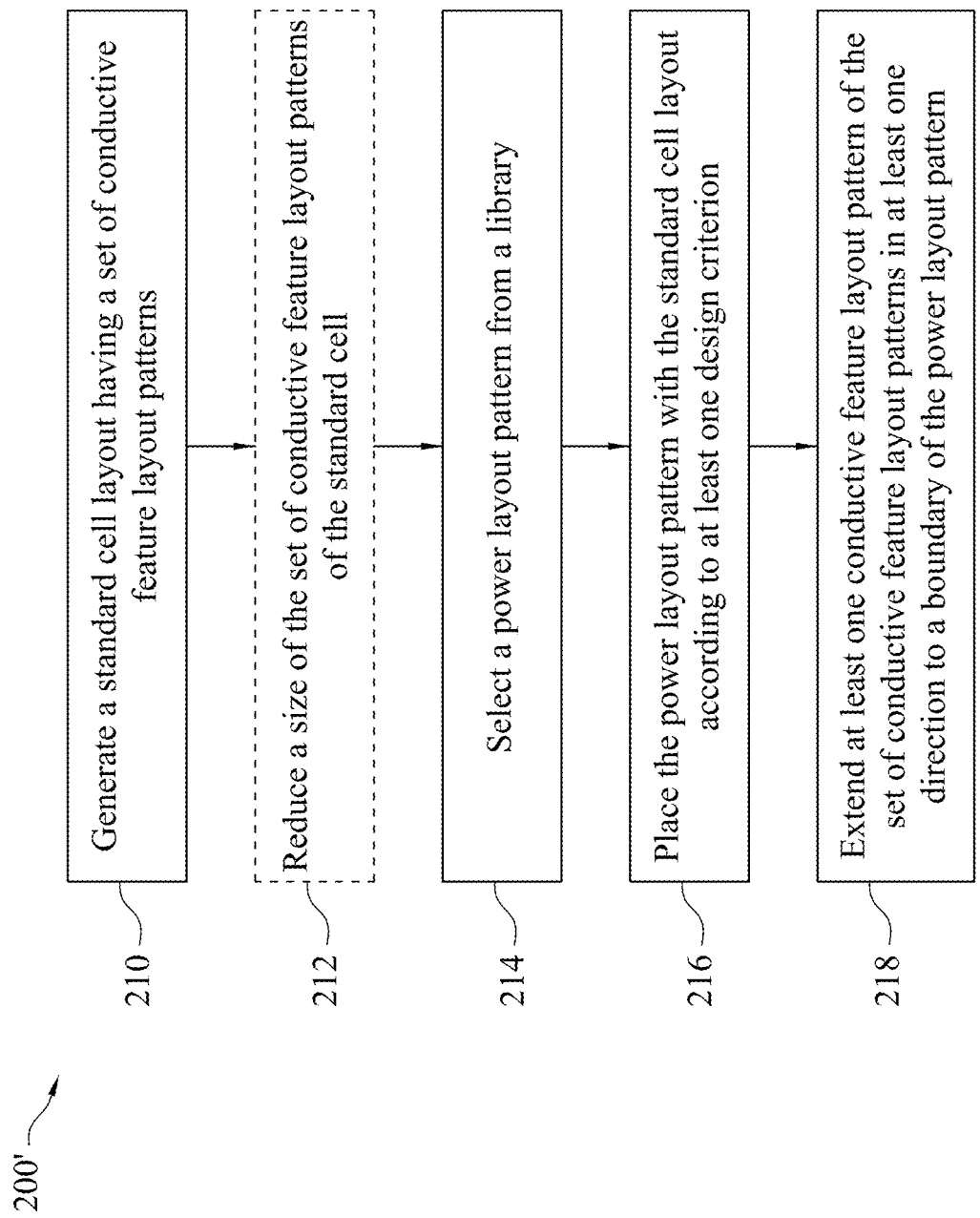
FIG. 2B is a flowchart of a method of generating a layout design of an integrated circuit, in accordance with some embodiments.

FIG. 2B is a flowchart of a method 200' of generating a layout design 500' of a portion of integrated circuit 100 in accordance with some embodiments. It is understood that additional operations may be performed before, during, and/or after the method 200' depicted in FIG. 2B, and that some other processes may only be briefly described herein.

Method 200' is an embodiment of operation 202 of FIG. 2 with similar elements. In some embodiments, method 200' is usable to form layout designs, such as layout design 300, 300' (FIGS. 3A-3B), layout design 400 (FIG. 4), layout designs 500, 500' (FIGS. 5A-5B), layout design 600 (FIG. 6), layout design 700 (FIG. 7), layout design 800 (FIG. 8), layout design 900 (FIG. 9), layout design 1000 (FIG. 10), layout design 1100 (FIG. 11).

In operation 210 of method 200', a layout 300 of a standard cell 301 (FIG. 3A) is generated. The layout 300 of the standard cell 301 has a set of conductive feature layout patterns 311. The set of conductive feature layout patterns 311 includes conductive feature layout patterns 302, 304, 306, 308 and 310. In some embodiments, the set of conductive feature layout patterns 311 has more or less members than that shown in FIG. 3A. In some embodiments, operation 210 comprises retrieving the layout 300 of the standard cell 301 from a standard cell library, e.g., standard cell library 1218 (FIG. 12), and placing the layout 300 of the standard cell 301 into one or more desired locations on the layout design 502 (FIG. 5A) of integrated circuit 100. In some embodiments, the layout 300 of the standard cell 301 includes pre-designed layouts of standard circuit elements.

One or more of the set of conductive feature layout patterns 311 is a layout pattern usable to manufacture one or more of first conductive structure 104a, second conductive structure 104b or third conductive structure 104c.

Figures 3A, 3B:
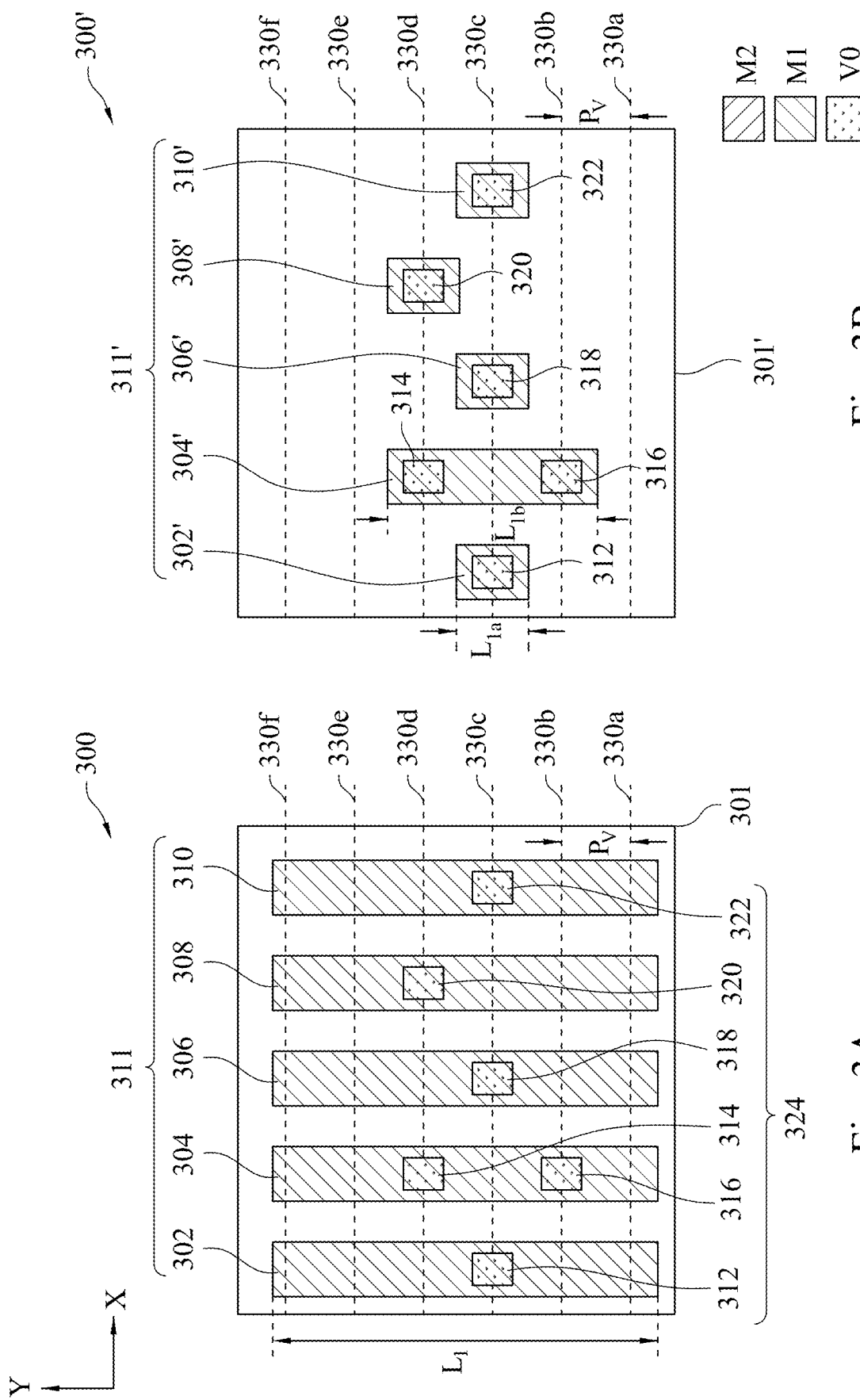
FIG. 3A is a diagram of a portion of a layout design usable as a standard cell of FIGS. 2A-2B, in accordance with some embodiments.
FIG. 3B is a diagram of a portion of a layout design usable as the standard cell of FIGS. 2A-2B, in accordance with some embodiments.

Method 200' continues with operation 212, where a size of the set of conductive feature layout patterns 311 of standard cell 301 is reduced thereby generating a set of conductive feature layout patterns 311' (FIG. 3B). In some embodiments, the set of conductive feature layout patterns 311' is the set of conductive feature layout patterns after operation 212. For example, in some embodiments, conductive feature layout patterns 302', 304', 306', 308' and 310' are corresponding conductive feature layout patterns 302, 304, 306, 308 and 310 after operation 212. In some embodiments, the size of the set of conductive feature layout patterns 311 that is reduced includes a length in either the first direction X or the second direction Y. In some embodiments, the size of the set of conductive feature layout patterns 311 is reduced in a single direction. In some embodiments, operation 212 is optional when layout 300 of the standard cell standard cell 301 includes set of conductive feature layout patterns 311'.

Figure 11:
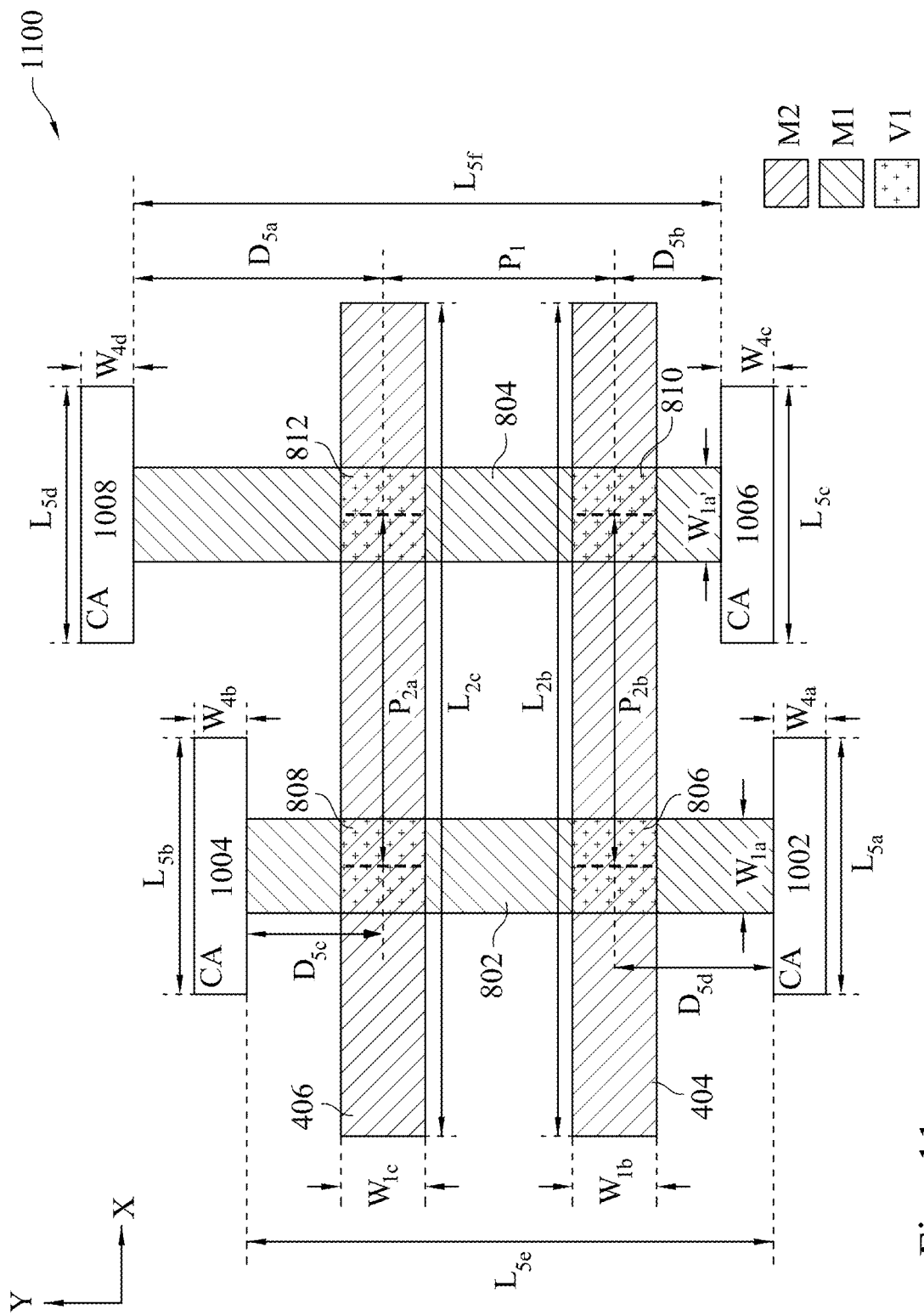
FIG. 11 is a diagram of a portion of a layout design usable as the power layout pattern of FIGS. 5A-5B, in accordance with some embodiments.
Figure 12:
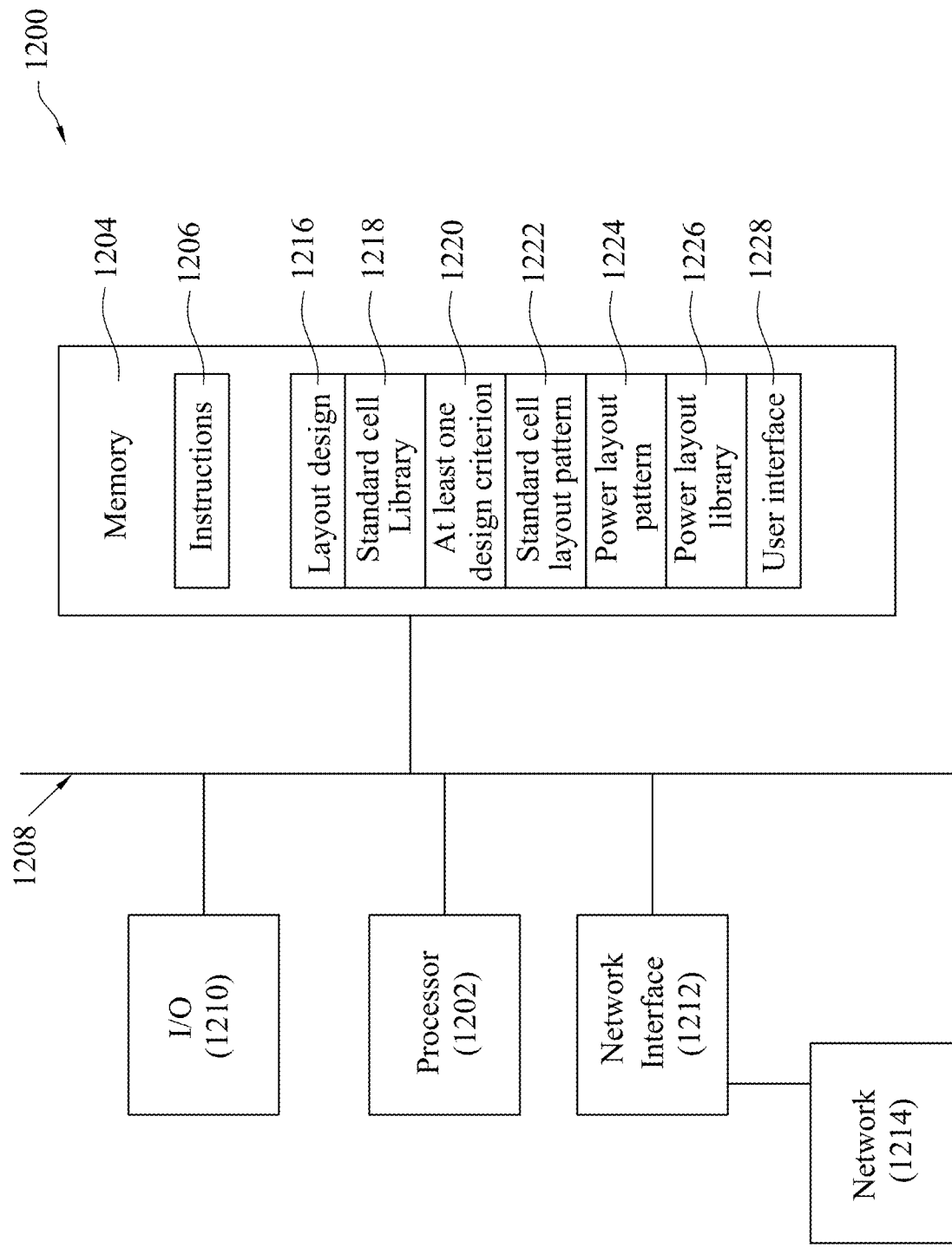
FIG. 12 is a block diagram of a system of forming a layout design in accordance with some embodiments.

Method 200' continues with operation 214, where a power layout pattern 510 (FIG. 5A) is selected from a library 1226 (FIG. 12). Power layout pattern 510 (FIG. 5A) is a layout pattern usable to manufacture power structure 120 (FIG. 1). In some embodiments, library 1226 (FIG. 12) includes one or more pre-designed layouts of power structure 120. In some embodiments, the one or more pre-designed layouts of power structure 120 include layout design 400 (FIG. 4), layout design 600 (FIG. 6), layout design 700 (FIG. 7), layout design 800 (FIG. 8), layout design 900 (FIG. 9), layout design 1000 (FIG. 10) and layout design 1100 (FIG. 11).

Method 200' continues with operation 216, where the power layout pattern 510 is placed with the layout of the standard cell 502a (FIGS. 5A-5B) according to at least one design criterion. In some embodiments, operation 216 comprises placing the power layout pattern 510 into one or more desired locations on layout pattern 500 (FIG. 5A-5B).

In some embodiments, the at least one design criterion are received from a user or an external component in operation 216. In some embodiments, the at least one design criterion are generated based on received information from the user or the external component.

In some embodiments, the at least one design criterion of the integrated circuit 100 includes the power layout pattern 510 not overlapping the set of conductive feature layout patterns 311' (e.g., conductive feature layout patterns 302', 304', 306', 308' and 310').

In some embodiments, the at least one design criterion of the integrated circuit 100 includes the power layout pattern 510 being separated from conductive feature layout patterns 302', 304', 306', 308' and 310' or vias 312, 314, 316, 318, 320, 322 by at least a minimum spacing (e.g., width $W_{1d}$ of cut feature layout pattern 412). In some embodiments, the minimum spacing is in the first direction X or the second direction Y. In some embodiments, the minimum spacing corresponds to width $W_{1d}$, $W_{1e}$ of cut feature layout pattern 412, 414.

In some embodiments, the at least one design criterion of the integrated circuit includes no direct contact between conductive feature layout pattern 402 (FIG. 4) of power layout pattern 400 and conductive feature layout patterns 302', 304', 306', 308' or 310'. In some embodiments, the at least one design criterion of the integrated circuit includes no direct contact between power layout pattern 510 and vias 312, 314, 316, 318, 320 or 322. In some embodiments, the at least one design criterion of integrated circuit 100 includes conductive feature layout pattern 402 (FIG. 4) of power layout pattern 400 being aligned with conductive feature layout patterns 302', 304', 306', 308' or 310' in the first direction X.

Method 200' continues with operation 218, where at least one conductive feature layout pattern 306' of the set of conductive feature layout patterns 311' is extended in at least one direction to a boundary 520 (FIGS. 5A-5B) of the power layout pattern 510. In some embodiments, in operation 218, the at least one conductive feature layout pattern 306' of the set of conductive feature layout patterns 311' is extended until direct contact with the boundary 520 of the cut feature layout pattern 412 of the power layout pattern 510. In some embodiments, in operation 218, if at least one conductive feature layout pattern 302', 304', 306', 308' or 310' of the set of conductive feature layout patterns 311' is extended in operation 218 of method 200', then the extended conductive feature layout pattern 302', 304', 306', 308' or 310' of the set of conductive feature layout patterns 311' is cut in operation 206 of method 200. For example, in the same embodiments, if a single end of a conductive feature layout pattern 302', 304', 306', 308' or 310' of the set of conductive feature layout patterns 311' is cut in operation 206 of method 200, then the same end of the corresponding conductive feature layout pattern of conductive feature layout pattern 302', 304', 306', 308' or 310' is also extended in operation 218 of method 200' in a single direction. In some embodiments, in operation 218, the conductive feature layout pattern 302', 304', 308' or 310' of the set of conductive feature layout patterns 311' is extended provided the extended conductive feature layout pattern 302', 304', 308' or 310' does not overlap other layout patterns (not shown) of the same layer or level of IC 100.

In some embodiments, the at least one conductive feature layout pattern 306' of the set of conductive feature layout patterns 311' is extended if the at least one conductive feature layout pattern 306' of the set of conductive feature layout patterns 311' satisfies at least one design rule. In some embodiments, the at least one design rule includes (1) an alignment design rule and (2) a spacing design rule. In some embodiments, the alignment design rule is an alignment rule between the sides 306a', 306b' of the conductive feature layout pattern 306' and the corresponding sides 402a, 402b of the conductive feature layout pattern 402 in the first direction X. For example, if the sides 306a', 306b' of the conductive feature layout pattern 306' and the corresponding sides 402a, 402b of the conductive feature layout pattern 402 are aligned in the first direction X, and if the spacing design rule is satisfied, then conductive feature layout pattern 306' is extended.

In some embodiments, the spacing design rule includes spacing requirements between conductive feature layout pattern 306' and conductive feature layout pattern 402 in the second direction Y. For example, in some embodiments, the spacing design rule ensures that conductive feature layout pattern 306' and conductive feature layout pattern 402 are not extended if conductive feature layout patterns 306' and 402 are overlapping layout patterns. In some embodiments, the spacing requirements between conductive feature layout pattern 306' and conductive feature layout pattern 402 in the second direction Y correspond to the distance $D_{Y1}$ (FIG. 5B) between conductive feature layout pattern 306' of standard cell 502a and the conductive feature layout pattern 402 of power layout pattern 510 being greater than a width $W_{1d}$, $W_{1e}$ of the cut feature layout pattern 412, 414.

For example, in some embodiments, the at least one conductive feature layout pattern 306' of the set of conductive feature layout patterns 311' is extended if (1) the sides 306a', 306' of conductive feature layout pattern 306' is aligned with the corresponding sides 402a, 402b of conductive feature layout pattern 402 of power layout pattern 510 in the first direction X, and (2) the distance between conductive feature layout pattern 306' of standard cell 502a and the conductive feature layout pattern 402 of power layout pattern 510 is greater than a width $W_{1d}$, $W_{1e}$ of the cut feature layout pattern 412, 414. In some embodiments, by extending the length of the at least one conductive feature layout pattern 306' of the set of conductive feature layout patterns 311', additional via access points are provided that are capable of being coupled to other underlying or overlying layers.

One or more of operations 210, 212, 214, 216 or 218 is performed by a processing device configured to execute instructions for generating a layout design 500' (FIG. 5B) of integrated circuit 100. In some embodiments, an operation of operations 210-218 is performed using a same processing device as that used in another of operations 210-218. In some embodiments, a different processing device is used to perform an operation of operations 210-218 from that used to perform another of operations 210-218.

Using at least one of the presently disclosed methods, integrated circuit 100 or layout design 400, 500, 500', 600, 700, 800, 900, 1000 or 1100 occupies less area than other approaches. For example, in some embodiments, using layout design 400, 500, 500', 600, 700, 800, 900, 1000 or 1100, method 200 or 200' is utilized to manufacture conductive structures (e.g., conductive structure 104b and conductive structure 122) that are spaced closer together, occupy less area and provide additional via access points than other approaches. In these embodiments, since conductive structure 104b and conductive structure 122 of power structure 120 of integrated circuit 100 are spaced closer to each other than other approaches, conductive structure 104b and conductive structure 122 can be manufactured with increased lengths and also provide additional routing resources than other approaches.

Using at least one of the presently disclosed embodiments, the power layout pattern (e.g., layout design 400, 500, 500', 600-1100) can be spaced closer to conductive feature layout patterns (e.g., conductive feature layout patterns 306' and 504) and the layout design of the integrated circuit occupies less area than other approaches. For example, in some embodiments, conductive feature layout pattern 402 and conductive feature layout pattern (e.g., conductive feature layout patterns 306' and 504) of power layout pattern 510 are spaced closer to each other and occupies less area than other approaches. In some embodiments, conductive feature layout patterns 402, 306' & 504 are utilized to manufacture corresponding conductive structures in an integrated circuit (e.g., integrated circuit 100) that are spaced closer to each other and provide additional via access points than other approaches. For example, in some embodiments, by manufacturing conductive structure 104b and conductive structure 122 closer to each other than other approaches, conductive structure 104b and conductive structure 122 can be manufactured with increased lengths to provide additional via access points (to other metal layers or levels) than other approaches.

One of ordinary skill in the art would recognize that operations are able to be removed, or that additional operations are able to be added to method 200 or 200' without departing from the scope of this description. One of ordinary skill in the art would also recognize that an order of operations in method 200 or 200' is able to be adjusted without departing from the scope of this description.

FIG. 3A is a diagram of a portion of a layout design 300 usable as the standard cell in FIGS. 2A-2B, in accordance with some embodiments.

A portion of layout design 300 is usable to manufacture first region 102a of integrated circuit 100 (FIG. 1). In some embodiments, layout design 300 corresponds to the layout of the standard cell after operation 210 in method 200' (FIG. 2B).

Layout design 300 includes a standard cell 301. Standard cell 301 is usable to manufacture first region 102a of integrated circuit 100 (FIG. 1).

Standard cell 301 includes a conductive feature layout pattern 302, a conductive feature layout pattern 304, a conductive feature layout pattern 306, a conductive feature layout pattern 308 and a conductive feature layout pattern 310 (collectively referred to as "set of conductive feature layout patterns 311").

Standard cell 301 further includes a via layout pattern 312, a via layout pattern 314, a via layout pattern 316, a via layout pattern 318, a via layout pattern 320, a via layout pattern 322 (collectively referred to as "set of via layout patterns 324").

Standard cell 301 further includes gridlines 330a, 330b, 330c, 330d, 330e and 330f (collectively referred to as "gridlines 330").

Set of conductive feature layout patterns 311 extends in the second direction Y. Set of conductive feature layout patterns 311 have a length $L_1$ in the second direction Y. In some embodiments, set of conductive feature layout patterns 311 is located on the first metal layer M1.

Conductive feature layout pattern 302 overlaps via layout pattern 312. Conductive feature layout pattern 304 overlaps via layout pattern 314 and via layout pattern 316. Conductive feature layout pattern 306 overlaps via layout pattern 318. Conductive feature layout pattern 308 overlaps via layout pattern 320. Conductive feature layout pattern 310 overlaps via layout pattern 322.

Via layout pattern 312 is below conductive feature layout pattern 302. Via layout pattern 312 is usable to form a via (e.g., third via 108 (FIG. 1)) connecting a conductive structure (e.g., second conductive structure 104b (FIG. 1)), defined by conductive feature layout pattern 302, and an underlying layer (not shown).

Via layout pattern 314 and via layout pattern 316 are below conductive feature layout pattern 304. Via layout pattern 314 is usable to form a via (e.g., first via 106a (FIG. 1)) connecting a conductive structure (e.g., first conductive structure 104a (FIG. 1)), formed by conductive feature layout pattern 304, and an underlying layer (not shown). Via layout pattern 316 is usable to form a via (e.g., second via 106b (FIG. 1)) connecting a conductive structure (e.g., first conductive structure 104a (FIG. 1)), formed by conductive feature layout pattern 304, and an underlying layer (not shown).

Via layout pattern 318 is below conductive feature layout pattern 306. Via layout pattern 318 is usable to form a via (e.g., third via 108 (FIG. 1)) connecting a conductive structure (e.g., second conductive structure 104b (FIG. 1)), formed by conductive feature layout pattern 306, and an underlying layer (not shown).

Via layout pattern 320 is below conductive feature layout pattern 308. Via layout pattern 320 is usable to form a via (e.g., fourth via 110 (FIG. 1)) connecting a conductive structure (e.g., third conductive structure 104c (FIG. 1)), formed by conductive feature layout pattern 308, and an underlying layer (not shown).

Via layout pattern 322 is below conductive feature layout pattern 310. Via layout pattern 322 is usable to form a via (e.g., third via 108 (FIG. 1)) connecting a conductive structure (e.g., second conductive structure 104b (FIG. 1)), formed by conductive feature layout pattern 310, and an underlying layer (not shown). In some embodiments, one or more of via layout patterns 312-322 is located between metal layer M0 and the first metal layer M1.

Gridlines 330 are arranged in first direction X. Each gridline of gridlines 330 is separated from an adjacent gridline of gridlines 330 by a pitch $P_Y$. In some embodiments, gridlines 330 define regions where vias are positioned. For example, a center portion of each via of set of via layout patterns 324 is aligned with corresponding gridlines 330. In some embodiments, gridlines 330 are positioned based upon locations of features (not shown) in upper or lower layers of layout design 300 being connected by the set of via layout patterns 324 or the process utilized to form integrated circuit 100.

FIG. 3B is a diagram of a portion of a layout design 300' usable as the standard cell in FIGS. 2A-2B, in accordance with some embodiments.

In some embodiments, layout design 300' corresponds to the standard cell after operation 212 in method 200' (FIG. 2B).

In comparison with layout design 300 of FIG. 3A, layout design 300' replaces conductive feature layout patterns 302, 304, 306, 308 and 310 of FIG. 3A with corresponding conductive feature layout patterns 302', 304', 306', 308' and 310'.

Each of conductive feature layout patterns 302', 306', 308' and 310' has a length $L_{1a}$ in the second direction Y. As shown in FIGS. 3A-3B, after operation 212 of method 200' (FIG. 2B), length $L_{1a}$ of conductive feature layout patterns 302', 306', 308' and 310' is less than $L_1$ of conductive feature layout patterns 302, 306, 308 and 310. In some embodiments, during operation 212 of method 200', length $L_{1a}$ of conductive feature layout pattern 302', 306', 308' or 310' is reduced until at least one end of conductive feature layout pattern 302', 306', 308' or 310' directly contacts at least one end of corresponding via layout pattern 312, 318, 320 or 322.

Conductive feature layout pattern 304' has a length $L_{1b}$ in the second direction Y. As shown in FIGS. 3A-3B, after operation 212 of method 200' (FIG. 2B), length $L_{1b}$ of conductive feature layout pattern 304' is less than $L_1$ of conductive feature layout pattern 304. In some embodiments, during operation 212 of method 200', length $L_{1b}$ of conductive feature layout pattern 304' is reduced until at least one end of conductive feature layout pattern 304' directly contacts at least one end of via layout pattern 314 or 316. In some embodiments, during operation 212 of method 200', length $L_{1a}$ of conductive feature layout pattern 302', 306', 308' or 310' or length $L_{1b}$ of conductive feature layout pattern 304' is reduced to be equal to or greater than ½ pitch $P_Y$.

A portion of layout design 300' is usable to manufacture first region 102a of integrated circuit 100 (FIG. 1). Layout design 300' includes a standard cell 301'. Standard cell 301' corresponds to standard cell 301 after operation 212 in method 200' (FIG. 2B). Standard cell 301' includes conductive feature layout pattern 302', conductive feature layout pattern 304', conductive feature layout pattern 306', conductive feature layout pattern 308', conductive feature layout pattern 310' and set of via layout patterns 324.

FIG. 4 is a diagram of a portion of a layout design 400 usable to manufacture the power structure 120 in FIG. 1, in accordance with some embodiments.

Layout design 400 includes a conductive feature layout pattern 402, a conductive feature layout pattern 404, a conductive feature layout pattern 406, a cut feature layout pattern 412, a cut feature layout pattern 414, a via layout pattern 408 and a via layout pattern 410.

Conductive feature layout pattern 402 extends in the second direction Y. Conductive feature layout pattern 402 has a width $W_{1a}$ in the first direction X, and a length $L_{2a}$ in the second direction Y. In some embodiments, conductive feature layout pattern 402 is located on the first metal layer M1. Conductive feature layout pattern 402 is usable to form fourth conductive structure 122 (FIG. 1).

Conductive feature layout pattern 404 extends in the first direction X and overlaps at least a portion of the conductive feature layout pattern 402. Conductive feature layout pattern 404 has a width $W_{1b}$ in the second direction Y, and a length $L_{2b}$ in the first direction X. In some embodiments, conductive feature layout pattern 404 is located on the same layer (e.g., M2) as conductive feature layout pattern 406. In some embodiments, conductive feature layout pattern 404 is parallel to conductive feature layout pattern 406, cut feature layout pattern 412 or cut feature layout pattern 414. In some embodiments, conductive feature layout pattern 404 is perpendicular to conductive feature layout pattern 402. Conductive feature layout pattern 404 is usable to form fifth conductive structure 124 (FIG. 1).

Conductive feature layout pattern 406 extends in the first direction X and overlaps at least a portion of the conductive feature layout pattern 402. Conductive feature layout pattern 406 has a width $W_{1c}$ in the second direction Y, and a length $L_{2c}$ in the first direction X. In some embodiments, conductive feature layout pattern 406 is located on the second metal layer M2. In some embodiments, conductive feature layout pattern 406 is parallel to conductive feature layout pattern 404, cut feature layout pattern 412 or cut feature layout pattern 414. In some embodiments, conductive feature layout pattern 406 is perpendicular to conductive feature layout pattern 402. A center of conductive feature layout pattern 406 is separated from a center of conductive feature layout pattern 404 in the second direction Y by a pitch $P_1$. Conductive feature layout pattern 406 is usable to form sixth conductive structure 126 (FIG. 1).

Via layout pattern 408 is below conductive feature layout pattern 404 and overlaps at least a portion of the conductive feature layout pattern 402. In some embodiments, via layout pattern 408 is located between the first metal layer M1 and the second metal layer M2. A center of via layout pattern 408 is separated from a center of via layout pattern 410 in the second direction Y by pitch $P_1$. Via layout pattern 408 is usable to form fifth via 128a (FIG. 1) connecting the fourth conductive structure 122 and the fifth conductive structure 124.

Via layout pattern 410 is below conductive feature layout pattern 406 and overlaps at least a portion of the conductive feature layout pattern 402. In some embodiments, via layout pattern 410 is located between the first metal layer M1 and the second metal layer M2. Via layout pattern 410 is usable to form sixth via 128b (FIG. 1) connecting the fourth conductive structure 122 and the sixth conductive structure 126.

Cut feature layout pattern 412 extends in the first direction X. An edge of cut feature layout pattern 412 directly contacts an edge of the conductive feature layout pattern 402. Cut feature layout pattern 412 has a width $W_{1d}$ in the second direction Y, and a length $L_{2d}$ in the first direction X. In some embodiments, cut feature layout pattern 412 is located on the same layer (e.g., M1) as conductive feature layout pattern 402. In some embodiments, cut feature layout pattern 412 is parallel to conductive feature layout pattern 404, conductive feature layout pattern 406 or cut feature layout pattern 414. In some embodiments, cut feature layout pattern 412 is perpendicular to conductive feature layout pattern 402. The center of conductive feature layout pattern 404 is separated from an edge of cut feature layout pattern 412 in the second direction Y by a distance $D_{1b}$.

Cut feature layout pattern 414 extends in the first direction X. An edge of cut feature layout pattern 414 directly contacts an edge of the conductive feature layout pattern 402. Cut feature layout pattern 414 has a width $W_{1e}$ in the second direction Y, and a length $L_{2e}$ in the first direction X. In some embodiments, cut feature layout pattern 412 or 414 is located on the first metal layer M1. In some embodiments, cut feature layout pattern 414 is located on the same layer (e.g., M1) as conductive feature layout pattern 402. In some embodiments, cut feature layout pattern 414 is parallel to conductive feature layout pattern 404, conductive feature layout pattern 406 or cut feature layout pattern 412. In some embodiments, cut feature layout pattern 414 is perpendicular to conductive feature layout pattern 402. The center of conductive feature layout pattern 406 is separated from an edge of cut feature layout pattern 414 in the second direction Y by a distance $D_{1a}$.

FIG. 5A is a diagram of a portion of a layout design 500 of an integrated circuit, in accordance with some embodiments.

A portion of layout design 500 is usable to manufacture integrated circuit 100 of FIG. 1. Layout design 500 is layout design 300' (FIG. 3B) and layout design 400 (FIG. 4) combined after operation 216 of method 200' of FIG. 2B.

Layout design 500 includes standard cell 502a, 502b and a power layout pattern 510. Standard cell 502a standard cell 301' (FIG. 3B). Standard cell 502b is second region 102b (FIG. 1). For simplicity layout design 500 does not include gridlines 330 (FIG. 3B). Power layout pattern 510 is power layout pattern 400 (FIG. 4).

In some embodiments, layout design 500 is checked by operation 216 of method 200' ensuring that layout design 500 is placed according to at least one design criterion. For example, in this embodiment, the at least one design criterion includes overlap, such that power layout pattern 510 is placed with the layout design of the standard cell 502a. In this embodiment, layout design 500 satisfies the at least one design criterion by not overlapping conductive feature layout pattern 302', 304', 306' 308' or 310'. As shown in FIG. 5A, after operation 216 of method 200', system 1200 (FIG. 12) displays "Ok" to the user, by a user interface 1230, showing satisfaction of the at least one design criterion.

FIG. 5B is a diagram of a portion of a layout design 500' of an integrated circuit, in accordance with some embodiments.

A portion of layout design 500' is usable to manufacture integrated circuit 100 of FIG. 1. Layout design 500' is layout design 500 (FIG. 3B) after operation 218 of method 200' of FIG. 2B.

In comparison with layout design 500 of FIG. 5A, layout design 500' further includes a conductive feature layout pattern 504. Conductive feature layout pattern 504 is a variation of conductive feature layout pattern 306' (FIG. 3B). Conductive feature layout pattern 504 extends in the second direction Y from an edge 518 of conductive feature layout pattern 306' to a boundary 520 of power layout pattern 510. The boundary 520 of power layout pattern 510 corresponds to a cut boundary of cut feature layout pattern 412. Conductive feature layout pattern 504 has a same width (not shown) as the width of conductive feature layout pattern 306'.

Figure 6:
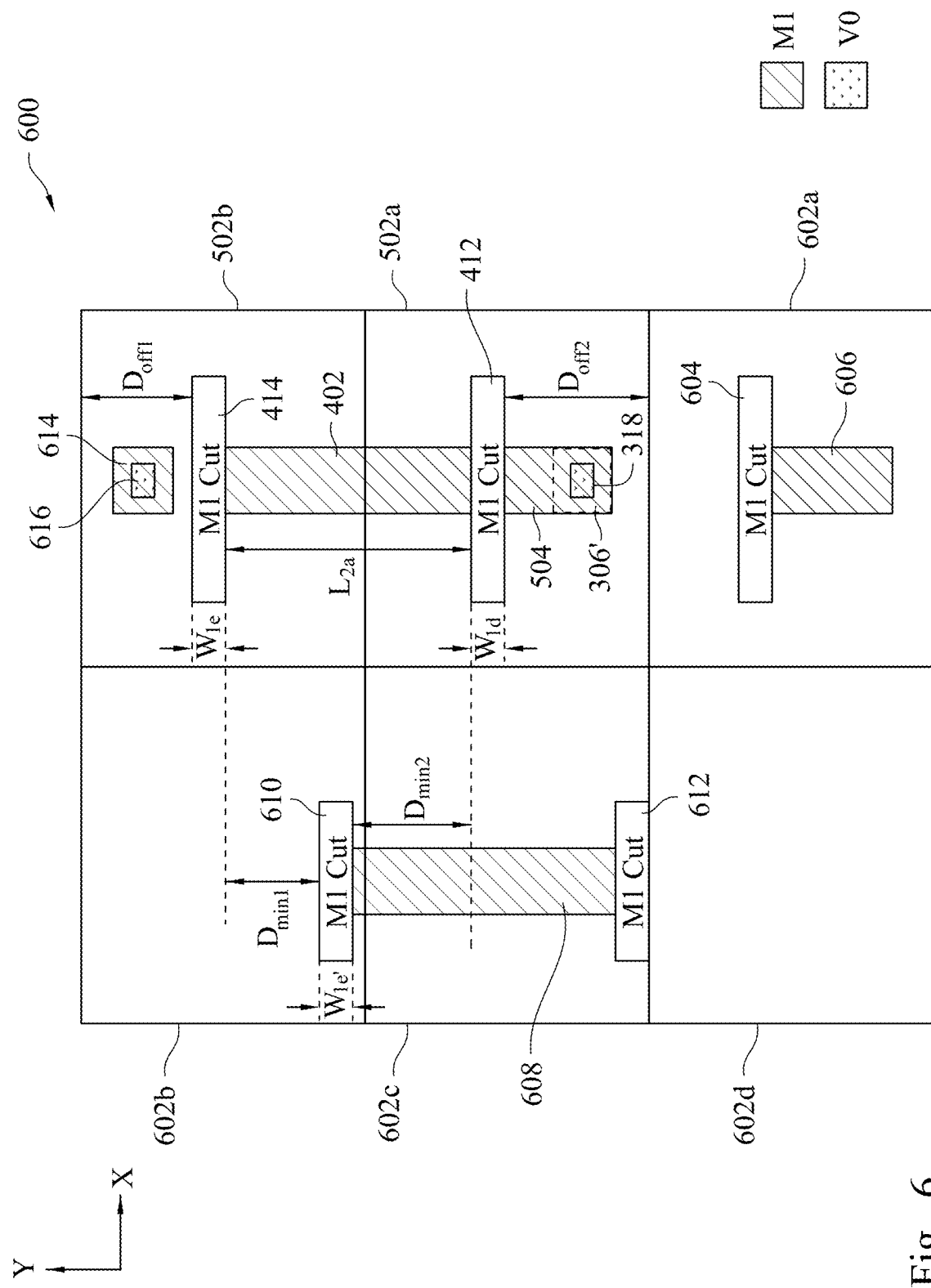
FIG. 6 is a diagram of a portion of a layout design of an integrated circuit, in accordance with some embodiments.

FIG. 6 is a diagram of a portion of a layout design 600 of an integrated circuit, in accordance with some embodiments.

Layout design 600 is a variation of layout design 500' of FIG. 5B. Layout design 600 includes portions of layout design 500' of FIG. 5B. For example, layout design 600 includes standard cells 502a, 502b, conductive feature layout patterns 402, 306' and 504, via layout pattern 318 and cut feature layout patterns 412 and 414 from layout design 500' of FIG. 5B. In comparison with layout design 500' of FIG. 5B, layout design 600 further includes a standard cell 602a, a standard cell 602b, a standard cell 602c, a standard cell 602d, a conductive feature layout pattern 608, a cut feature layout pattern 610, a cut feature layout pattern 612, a conductive feature layout pattern 614 and a via layout pattern 616.

Standard cell 602a is a variation of standard cell 502a. Standard cell 602b, 602c or 602d is a variation of corresponding standard cell 502b, 502a or 602a.

Standard cell 602a is directly next to standard cells 502a and 602d. In some embodiments, standard cell 602a is separated from standard cell 502a or 602d by one or more standard cells. Standard cell 602a includes a cut feature layout pattern 604 and a conductive feature layout pattern 606.

Cut feature layout pattern 604 is a variation of cut feature layout pattern 414. Cut feature layout pattern 604 extends in the first direction X. An edge of cut feature layout pattern 604 directly contacts an edge of the conductive feature layout pattern 606. Cut feature layout pattern 604 has a width (not shown) in the second direction Y, and a length (not shown) in the first direction X. In some embodiments, cut feature layout pattern 604 is located on the same layer (e.g., M1) as conductive feature layout pattern 606. In some embodiments, cut feature layout pattern 604 is parallel to cut feature layout pattern 412, 414, 610 or 612. In some embodiments, cut feature layout pattern 604 is perpendicular to conductive feature layout pattern 606.

Conductive feature layout pattern 606 is a variation of conductive feature layout pattern 402. Conductive feature layout pattern 606 extends in the second direction Y. In some embodiments, conductive feature layout pattern 606 is located on the first metal layer M1. In some embodiments, conductive feature layout pattern 606 is usable to form a corresponding seventh conductive structure (not shown), and cut feature layout pattern 604 identifies a location of a portion of the seventh conductive structure (not shown) that is removed by operation 206 of method 200.

Standard cell 602b is directly next to standard cells 502b and 602c. In some embodiments, standard cell 602b is separated from standard cell 502b or 602c by one or more standard cells. Standard cell 602c is directly next to standard cells 602b, 502a and 602d. In some embodiments, standard cell 602c is separated from standard cell 502a, 602b or 602d by one or more standard cells. Standard cell 602d is directly next to standard cells 602c and 602a. In some embodiments, standard cell 602c is separated from standard cell 602c or 602a by one or more standard cells.

Standard cells 602b and 602c include conductive feature layout pattern 608, cut feature layout pattern 610 and cut feature layout pattern 612. In some embodiments, each of conductive feature layout pattern 608, cut feature layout pattern 610 and cut feature layout pattern 612 is part of standard cell 602b. In some embodiments, each of conductive feature layout pattern 608, cut feature layout pattern 610 and cut feature layout pattern 612 is part of standard cell 602c.

Conductive feature layout pattern 608 extends in the second direction Y. In some embodiments, conductive feature layout pattern 608 is located on the first metal layer M1. Conductive feature layout pattern 608 is usable to form an eighth conductive structure (not shown).

Cut feature layout pattern 610 extends in the first direction X. An edge of cut feature layout pattern 610 directly contacts an edge of the conductive feature layout pattern 608. Cut feature layout pattern 610 has a width $W_{1e}$, in the second direction Y, and a length (not shown) in the first direction X. In some embodiments, cut feature layout pattern 610 is located on the same layer (e.g., M1) as conductive feature layout pattern 608. In some embodiments, cut feature layout pattern 610 is parallel to cut feature layout pattern 412, 414, 604 or 612. In some embodiments, cut feature layout pattern 610 is perpendicular to conductive feature layout pattern 608. An edge of cut feature layout pattern 610 is separated from an edge of cut feature layout pattern 414 in the second direction Y by a distance $D_{min1}$. Another edge of cut feature layout pattern 610 is separated from an edge of cut feature layout pattern 412 in the second direction Y by a distance $D_{min2}$.

Cut feature layout pattern 612 extends in the first direction X. An edge of cut feature layout pattern 612 directly contacts another edge of the conductive feature layout pattern 608. Cut feature layout pattern 612 has a width (not shown) in the second direction Y, and a length (not shown) in the first direction X. In some embodiments, cut feature layout pattern 612 is located on the same layer (e.g., M1) as conductive feature layout pattern 608. In some embodiments, cut feature layout pattern 612 is parallel to cut feature layout pattern 412, 414, 604 or 610. In some embodiments, cut feature layout pattern 612 is perpendicular to conductive feature layout pattern 608.

In some embodiments, conductive feature layout pattern 608 is usable to form a corresponding ninth conductive structure (not shown), cut feature layout pattern 610 identifies a location of a portion of the ninth conductive structure (not shown) that is removed by operation 206 of method 200, and cut feature layout pattern 612 identifies a location of another portion of the ninth conductive structure (not shown) that is removed by operation 206 of method 200.

In some embodiments, the ninth conductive structure is a signal pin (not shown). In some embodiments, the signal pin is configured to carry a logical signal. In some embodiments, the ninth conductive structure is a power structure (not shown). In some embodiments, the ninth conductive structure is configured to provide the first supply voltage VDD or the second supply voltage VSS to standard cell 602b or 602c.

A relationship between a minimum length L of conductive feature layout patterns and a minimum spacing D between a pair of parallel cut feature layout patterns is expressed by formula 1:

$$L=(I*W)+(I+1)*(D) \quad (1)$$

where I is an integer greater than or equal to 0, W is a width of a cut feature layout pattern in the first direction X or the second direction Y, and D is the minimum spacing between a pair of parallel cut feature layout patterns in the first direction X or the second direction Y.

The minimum length L expressed by Equation 1 is based upon a physical process limitation of manufacturing integrated circuits using conductive feature layout patterns. In some embodiments, conductive feature layout patterns having a length greater than the minimum length L results in integrated circuits able to overcome manufacturing variations and increases the yield. In some embodiments, conductive feature layout patterns having a length less than the minimum length L results in integrated circuits with possible flaws due to manufacturing variations or insufficient spacing between components and lowers the yield. In some embodiments, the minimum length L is the minimum length of the conductive feature layout pattern sufficient to form a corresponding conductive structure that has a length sufficient to provide at least one via access point.

Cut feature layout pattern 414 is separated from cut feature layout pattern 412 in the second direction Y by length $L_{2a}$. An edge of cut feature layout pattern 414 is separated from an edge of cut feature layout pattern 610 in the second direction Y by distance $D_{min1}$. An edge of cut feature layout pattern 610 is separated from an edge of cut feature layout pattern 412 in the second direction Y by distance $D_{min2}$. The length $L_{2a}$ of conductive feature layout pattern 402 is equal to the sum of width $W_{1e}$, distance $D_{min1}$ and distance $D_{min2}$.

Applying formula 1 when integer I is equal to 1, the minimum length L is expressed by formula 2:

$$L=W+(2*D) \quad (2)$$

Applying equation 1 or 2 to the conductive feature layout pattern 402, and substituting width $W_{1e}$ for the cut feature layout pattern width W, and distance $D_{min1}$ or distance $D_{min2}$ for distance D, the minimum length of conductive feature layout pattern 402 is equal to the sum of width $W_{1e}$, distance $D_{min1}$ and distance $D_{min2}$. The length $L_{2a}$ of conductive feature layout pattern 402 satisfies the minimum length limitation of formula 1 or 2 by being equal to the sum of width $W_{1e}$, distance $D_{min1}$ and distance $D_{min2}$.

Standard cell 502b further includes a conductive feature layout pattern 614 and a via layout pattern 616.

Conductive feature layout pattern 614 is a variation of conductive feature layout pattern 402. Conductive feature layout pattern 614 overlaps via layout pattern 616, and extends in the second direction Y. Conductive feature layout pattern 614 has a width (not shown) in the first direction X, and a length (not shown) in the second direction Y. In some embodiments, conductive feature layout pattern 614 is located on the first metal layer M1. Conductive feature layout pattern 614 is usable to form a tenth conductive structure (e.g., third conductive structure 104c). In some embodiments, conductive feature layout pattern 614 is extended to directly contact cut feature layout pattern 414. In some embodiments, conductive feature layout pattern 614 is extended to at least an edge of standard cell 502b. In some embodiments, conductive feature layout pattern 614 is extended by operation 218 of method 200'. In some embodiments, by utilizing conductive feature layout pattern 614, additional via access points are provided that are capable of being coupled to other underlying or overlying layers.

Via layout pattern 616 is a variation of via layout pattern 318. Via layout pattern 616 is below conductive feature layout pattern 614. Via layout pattern 616 is usable to form a via (e.g., fourth via 110) coupling the tenth conductive structure and an underlying layer (not shown). In some embodiments, the tenth conductive structure is third conductive structure 104c (FIG. 1).

In some embodiments, via layout patterns 616 and 318 are useable to form corresponding vias (e.g., via access points) capable of being coupled to other underlying or overlying layers. In some embodiments, one of via layout pattern 616 or 318 and the corresponding resultant via structure (e.g., via access point) is optional. In some embodiments, utilizing at least one of via layout pattern 616 or 318 and the corresponding resultant via structure (e.g., via access point) corresponds to a design rule utilized to manufacture one or more integrated circuits (e.g., IC structure 100) consistent with this disclosure.

An edge of cut feature layout pattern 414 is separated from an edge of standard cell 502b in the second direction Y by a distance $D_{off1}$. An edge of cut feature layout pattern 412 is separated from an edge of standard cell 502a in the second direction Y by a distance $D_{off2}$. Each of the cut feature layout patterns 412, 414, 604, 610 and 612 are separated from each other in the second direction Y by at least a minimum distance $D_{min1}$ or $D_{min2}$. In some embodiments, conductive feature layout pattern 306' is extended in the second direction Y to an edge of cut feature layout pattern 604.

Figure 7:
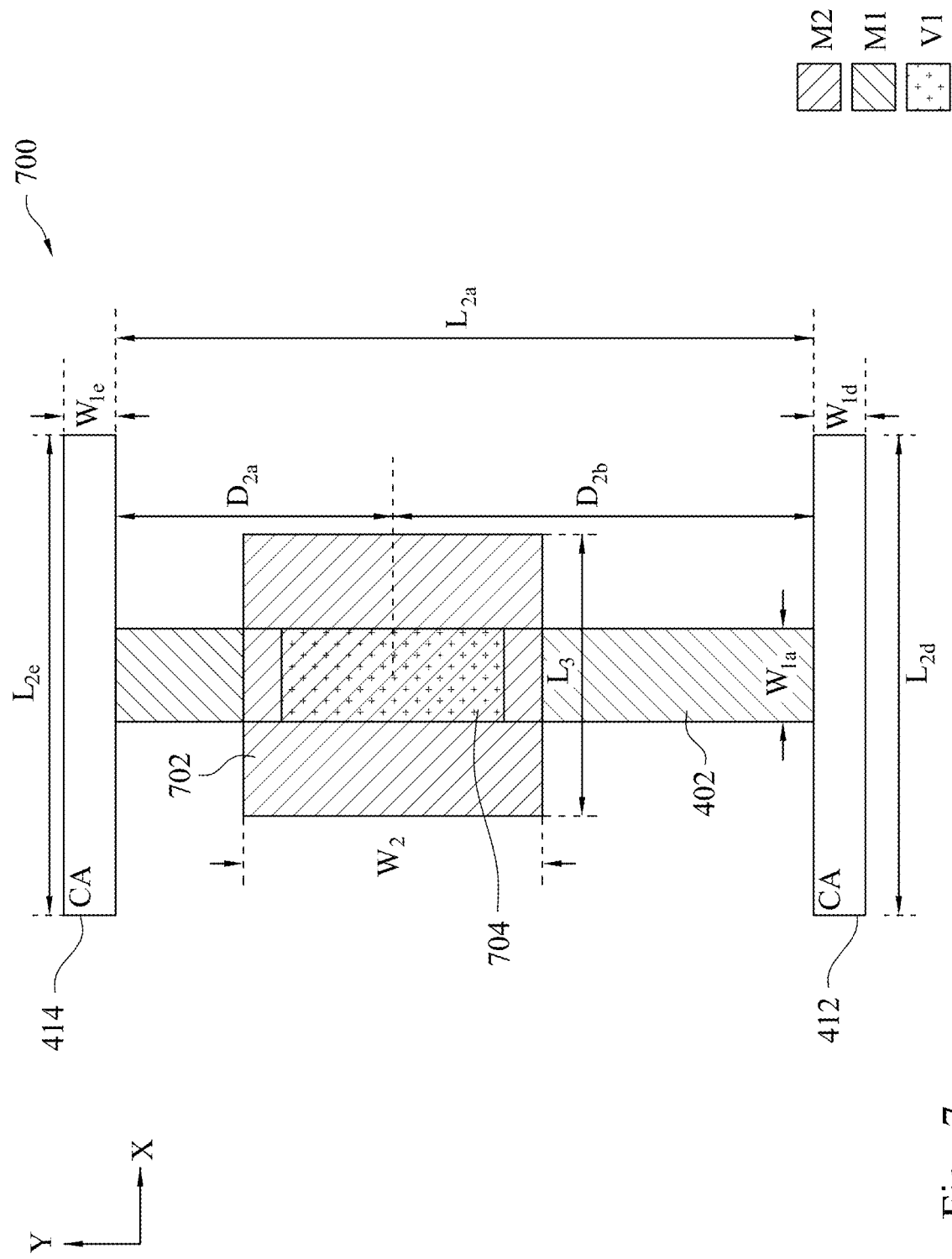
FIG. 7 is a diagram of a portion of a layout design usable as the power layout pattern of FIGS. 5A-5B, in accordance with some embodiments.

FIG. 7 is a diagram of a portion of a layout design 700 usable as the power layout pattern 510 in FIGS. 5A-5B, in accordance with some embodiments.

Layout design 700, 800, 900, 1000 or 1100 is usable to manufacture a power structure similar to that of FIG. 1. Layout design 700, 800, 900, 1000 or 1100 is an embodiment of the power layout pattern of operation 214 in method 200' of FIG. 2B.

Layout design 700 is a variation of layout design 400 (FIG. 4). In comparison with layout design 400 of FIG. 4, layout design 700 does not include conductive feature layout pattern 404, conductive feature layout pattern 406, via layout pattern 408 and via layout pattern 410.

Layout design 700 includes conductive feature layout pattern 402, cut feature layout pattern 412, cut feature layout pattern 414, a conductive feature layout pattern 702 and a via layout pattern 704. Conductive feature layout pattern 702 is a variation of conductive feature layout pattern 404 or 406. Via layout pattern 704 is a variation of via layout pattern 408 or 410.

Conductive feature layout pattern 702 extends in the second direction Y and overlaps at least a portion of the conductive feature layout pattern 402. Conductive feature layout pattern 702 has a width $W_2$ in the second direction Y, and a length $L_3$ in the first direction X. In some embodiments, conductive feature layout pattern 702 is located on the second metal layer M2. In some embodiments, conductive feature layout pattern 702 is parallel to cut feature layout pattern 412 or cut feature layout pattern 414. In some embodiments, conductive feature layout pattern 702 is perpendicular to conductive feature layout pattern 402. A center of conductive feature layout pattern 702 is separated from an edge of cut feature layout pattern 414 in the second direction Y by a distance $D_{2a}$. The center of conductive feature layout pattern 702 is separated from an edge of cut feature layout pattern 412 in the second direction Y by a distance $D_{2b}$. In some embodiments, conductive feature layout pattern 702 is used to form fifth conductive structure 124 or sixth conductive structure 126 (FIG. 1).

Via layout pattern 704 is below conductive feature layout pattern 702 and overlaps at least a portion of the conductive feature layout pattern 402. In some embodiments, via layout pattern 704 is located between the first metal layer M1 and the second metal layer M2. In some embodiments, via layout pattern 704 is usable to form fifth via 128a or sixth via 128b (FIG. 1). A center of via layout pattern 704 is separated from an edge of cut feature layout pattern 412 in the second direction Y by distance $D_{2b}$. A center of via layout pattern 704 is separated from an edge of cut feature layout pattern 414 in the second direction Y by distance $D_{2a}$. In some embodiments, the center of via layout pattern 704 is aligned with the center of conductive feature layout pattern 702 in the first direction X or the second direction Y.

Figure 8:
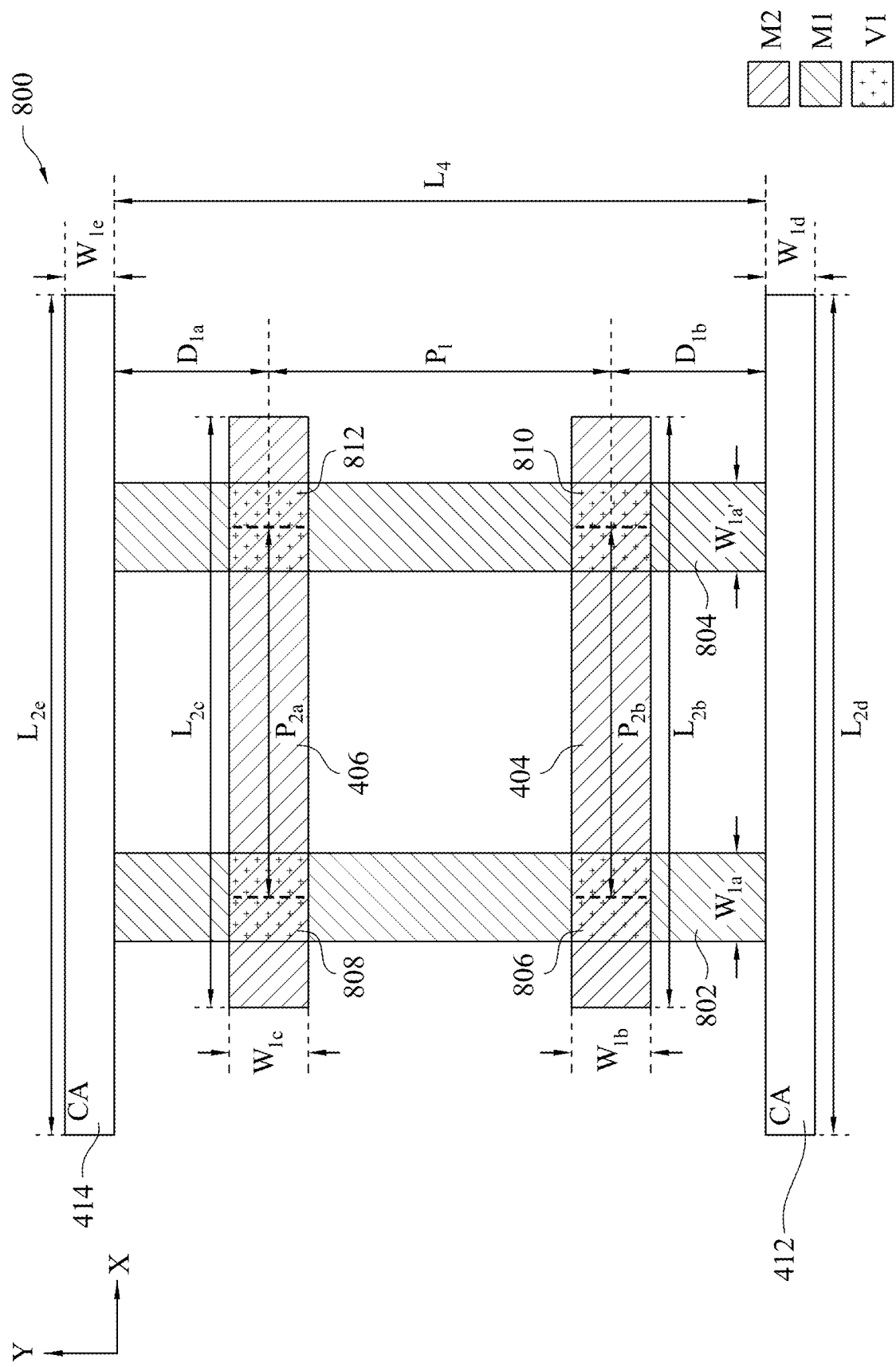
FIG. 8 is a diagram of a portion of a layout design usable as the power layout pattern of FIGS. 5A-5B, in accordance with some embodiments.

FIG. 8 is a diagram of a portion of a layout design 800 usable as the power layout pattern 510 in FIGS. 5A-5B, in accordance with some embodiments.

Layout design 800 is a variation of layout design 400 (FIG. 4). In comparison with layout design 400 of FIG. 4, layout design 800 replaces conductive feature layout pattern 402 with a conductive feature layout pattern 802, and via layout patterns 408, 410 with corresponding via layout patterns 806, 808; and layout design 800 further includes a conductive feature layout pattern 804, a via layout pattern 810 and a via layout pattern 812.

Conductive feature layout pattern 802 or 804 is a variation of conductive feature layout pattern 402 (FIG. 4). Via layout pattern 806 or 810 is a variation of via layout pattern 408. Via layout pattern 808 or 812 is a variation of via layout pattern 410.

Conductive feature layout pattern 802 or 804 extends in the second direction Y. Conductive feature layout pattern 802 or 804 has a corresponding width $W_{1a}$ or $W_{1a'}$ in the first direction X, and a length $L_4$ in the second direction Y. A center of conductive feature layout pattern 802 is separated from a center of conductive feature layout pattern 804 in the first direction X by pitch $P_{2a}$, $P_{2b}$. In some embodiments, conductive feature layout pattern 802 or 804 is located on the first metal layer M1. In some embodiments, conductive feature layout pattern 802 or 804 is perpendicular to conductive feature layout pattern 404, conductive feature layout pattern 406, cut feature layout pattern 412 or cut feature layout pattern 414. An edge of the conductive feature layout pattern 802 or 804 directly contacts cut feature layout pattern 412. Another edge of the conductive feature layout pattern 802 or 804 directly contacts cut feature layout pattern 414. In some embodiments, conductive feature layout pattern 802 or 804 is used to form fourth conductive structure 122 (FIG. 1).

Via layout pattern 806 or 810 is below conductive feature layout pattern 404. Via layout pattern 808 or 812 is below conductive feature layout pattern 406. Via layout pattern 806 or 808 overlaps at least a portion of the conductive feature layout pattern 802. Via layout pattern 810 or 812 overlaps at least a portion of the conductive feature layout pattern 804. In some embodiments, one or more of via layout pattern 806, 808, 810 or 812 is located between the first metal layer M1 and the second metal layer M2. A center of via layout pattern 806 is separated from a center of via layout pattern 808 in the second direction Y by pitch $P_1$. A center of via layout pattern 810 is separated from a center of via layout pattern 812 in the second direction Y by pitch $P_1$. A center of via layout pattern 806 is separated from a center of via layout pattern 810 in the first direction X by pitch $P_{2b}$. A center of via layout pattern 808 is separated from a center of via layout pattern 812 in the second direction Y by pitch $P_{2a}$. In some embodiments, via layout pattern 806 or 810 is usable to form fifth via 128a (FIG. 1). In some embodiments, via layout pattern 808 or 812 is usable to form sixth via 128b (FIG. 1).

Figure 9:
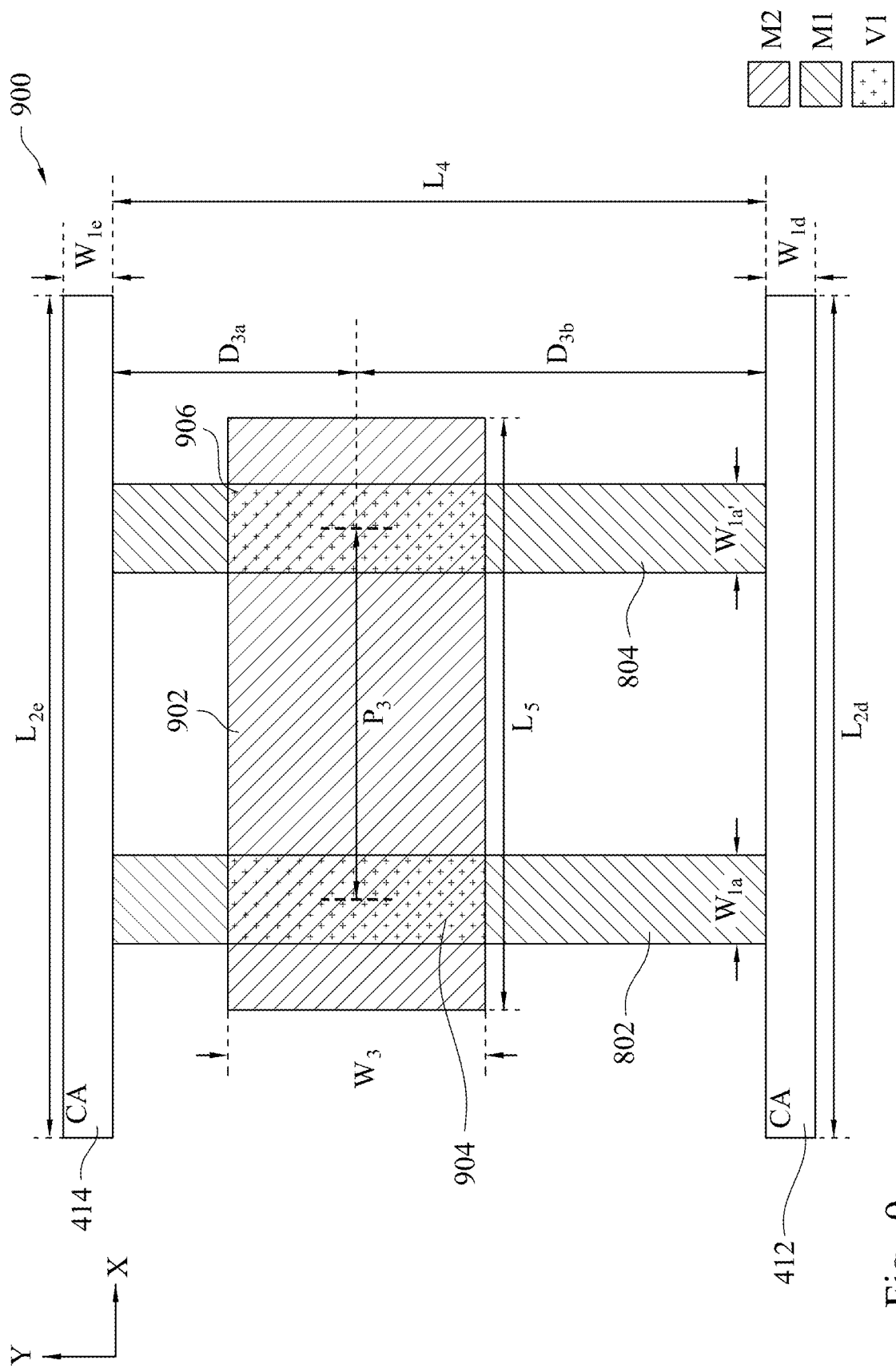
FIG. 9 is a diagram of a portion of a layout design usable as the power layout pattern of FIGS. 5A-5B, in accordance with some embodiments.

FIG. 9 is a diagram of a portion of a layout design 900 usable as the power layout pattern 510 in FIGS. 5A-5B, in accordance with some embodiments.

Layout design 900 is a variation of layout design 800 (FIG. 8). In comparison with layout design 800 of FIG. 8, layout design 900 replaces conductive feature layout pattern 404 with a conductive feature layout pattern 902, and via layout patterns 806, 810 with corresponding via layout patterns 904, 906, and does not include conductive feature layout pattern 406 and via layout patterns 808, 812.

Conductive feature layout pattern 902 is a variation of conductive feature layout pattern 404 or 406 (FIGS. 4 & 8). Via layout pattern 904 is a variation of via layout pattern 806 or 808 (FIG. 8). Via layout pattern 906 is a variation of via layout pattern 810 or 812.

Conductive feature layout pattern 902 extends in the first direction X and overlaps at least a portion of the conductive feature layout pattern 802 or 804. Conductive feature layout pattern 902 has a width $W_3$ in the second direction Y, and a length $L_5$ in the first direction X. In some embodiments, conductive feature layout pattern 902 is located on the second metal layer M2. In some embodiments, conductive feature layout pattern 902 is parallel to cut feature layout pattern 412 or cut feature layout pattern 414. In some embodiments, conductive feature layout pattern 902 is perpendicular to conductive feature layout pattern 802 or conductive feature layout pattern 804. A center of conductive feature layout pattern 902 is separated from an edge of cut feature layout pattern 414 in the second direction Y by a distance $D_{3a}$. The center of conductive feature layout pattern 902 is separated from an edge of cut feature layout pattern 412 in the second direction Y by a distance $D_{3b}$.

Via layout pattern 904 or 906 is below conductive feature layout pattern 902. Via layout pattern 904 or 906 overlaps at least a portion of the corresponding conductive feature layout pattern 802 or 804. In some embodiments, one or more of via layout pattern 904 or 906 is located between the first metal layer M1 and the second metal layer M2. A center of via layout pattern 904 is separated from a center of via layout pattern 906 in the first direction X by pitch $P_3$. In some embodiments, via layout pattern 904 is usable to form fifth via 128a (FIG. 1). In some embodiments, via layout pattern 906 is usable to form sixth via 128b (FIG. 1).

Figure 10:
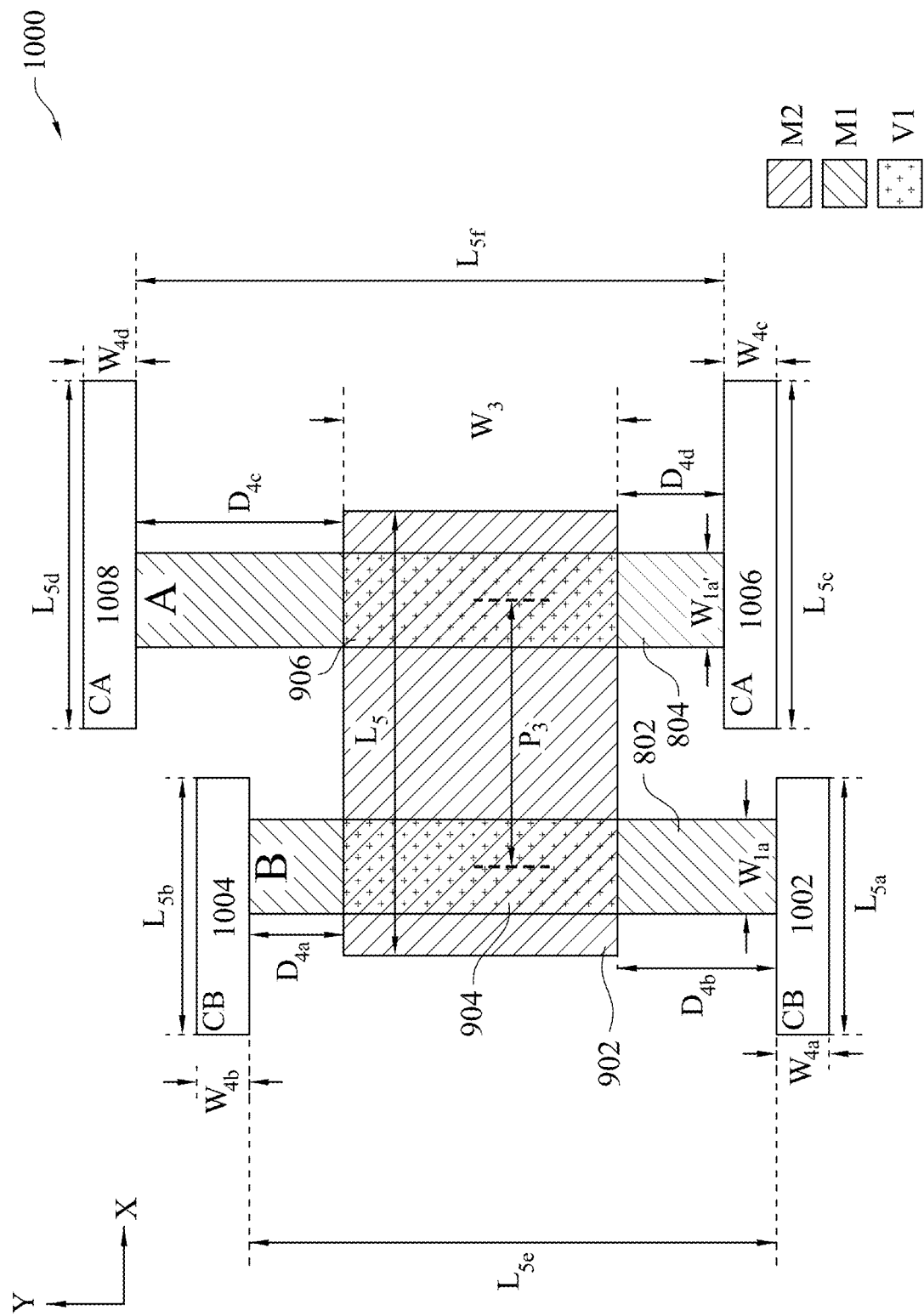
FIG. 10 is a diagram of a portion of a layout design usable as the power layout pattern of FIGS. 5A-5B, in accordance with some embodiments.

FIG. 10 is a diagram of a portion of a layout design 1000 usable as the power layout pattern 510 in FIGS. 5A-5B, in accordance with some embodiments.

Layout design 1000 is a variation of layout design 900 (FIG. 9). In comparison with layout design 900 of FIG. 9, layout design 1000 replaces cut feature layout pattern 412 with a cut feature layout pattern 1002 and a cut feature layout pattern 1006, and cut feature layout pattern 414 with a cut feature layout pattern 1004 and a cut feature layout pattern 1008.

Cut feature layout pattern 1002 or 1006 is a variation of cut feature layout pattern 412 (FIG. 8). Cut feature layout pattern 1004 or 1008 is a variation of cut feature layout pattern 414 (FIG. 8).

Cut feature layout pattern 1002, 1004, 1006 or 1008 extends in the first direction X. An edge of cut feature layout pattern 1002 or 1006 directly contacts an edge of the corresponding conductive feature layout pattern 802 or 804. An edge of cut feature layout pattern 1004 or 1008 directly contacts another edge of the corresponding conductive feature layout pattern 802 or 804. Cut feature layout pattern 1002, 1004, 1006 or 1008 has a corresponding width $W_{4a}$, $W_{4b}$, $W_{4c}$, or $W_{4d}$ in the second direction Y, and a corresponding length $L_{5a}$, $L_{5b}$, $L_{5c}$ or $L_{5d}$ in the first direction X. In some embodiments, cut feature layout pattern 1002, 1004, 1006 or 1008 is located on the first metal layer M1. In some embodiments, one or more of cut feature layout pattern 1002, 1004, 1006 or 1008 is located on the same layer (e.g., M1) as conductive feature layout pattern 802 or 804 or another of cut feature layout pattern 1002, 1004, 1006 or 1008.

In some embodiments, one or more of cut feature layout pattern 1002, 1004, 1006 or 1008 is parallel to conductive feature layout pattern 902 or another of cut feature layout pattern 1002, 1004, 1006 or 1008. In some embodiments, cut feature layout pattern 1002, 1004, 1006 or 1008 is perpendicular to conductive feature layout pattern 802 or 804. Conductive feature layout pattern 902 is separated from cut feature layout pattern 1002, 1004, 1006 or 1008 in the second direction Y by a corresponding distance $D_{4b}$, $D_{4a}$, $D_{4d}$ or $D_{4c}$. Conductive feature layout pattern 802 or 804 has a corresponding length $L_{5e}$ or $L_{5f}$ in the second direction Y.

In some embodiments, cut feature layout pattern 1002 and cut feature layout pattern 1004 have a same color (e.g., color B) as conductive feature layout pattern 802. The color (e.g., color B) indicates that features with the same color are to be formed on a same mask of a multiple mask set, and features with a different color are to be formed on a different mask of the multiple mask set. Two colors are depicted in FIG. 10 as an example. In some embodiments, there are more or less than two colors in layout design 1000.

In some embodiments, cut feature layout pattern 1006 and cut feature layout pattern 1008 have a same color (e.g., color A) as conductive feature layout pattern 804. In some embodiments, the color (e.g., color A) of cut feature layout pattern 1006, cut feature layout pattern 1008 and conductive feature layout pattern 804 is different than the color (e.g., color B) of cut feature layout pattern 1002, cut feature layout pattern 1004 and conductive feature layout pattern 802.

In some embodiments, if the distance P3 is less than a minimum spacing requirement between conductive features formed by a same mask, then the features of layout design 1000 are formed using two or more masks. For example, in some embodiments, if distance P3 is less than the minimum spacing requirement between conductive features formed by the same mask, then cut feature layout pattern 1006, cut feature layout pattern 1008 and conductive feature layout pattern 804 are formed using a first mask, and cut feature layout pattern 1002, cut feature layout pattern 1004 and conductive feature layout pattern 802 are formed using a second mask, where the first mask is different than the first mask. For example, in some embodiments, if distance P3 is greater than the minimum spacing requirement between conductive features formed by the same mask, then cut feature layout pattern 1006, cut feature layout pattern 1008 and conductive feature layout pattern 804 are formed using a same mask as that used to form cut feature layout pattern 1002, cut feature layout pattern 1004 and conductive feature layout pattern 802.

In some embodiments, the feature of FIG. 10 corresponding to different colors is applied to one or more features in layout design 400, 600, 800, 900 or 1100.

FIG. 11 is a diagram of a portion of a layout design 1100 usable as the power layout pattern 510 in FIGS. 5A-5B, in accordance with some embodiments.

Layout design 1100 is a variation of layout design 800 (FIG. 8) or layout design 1000 (FIG. 10), and includes features of layout design 800 (FIG. 8) and layout design 1000 (FIG. 10). For example, in comparison with layout design 1000 of FIG. 10, layout design replaces conductive feature layout pattern 902 with conductive feature layout pattern 404 and 406, and via layout patterns 904, 906 with via layout patterns 806, 808, 810 and 812. For example, layout design 1100 replaces cut feature layout pattern 412 of FIG. 8, with cut feature layout pattern 1002 and cut feature layout pattern 1006, and cut feature layout pattern 414 of FIG. 8 with cut feature layout pattern 1004 and cut feature layout pattern 1008.

A center of conductive feature layout pattern 404 is separated from cut feature layout pattern 1002 in the second direction Y by a distance $D_{5d}$. A center of conductive feature layout pattern 406 is separated from cut feature layout pattern 1004 in the second direction Y by a distance $D_{5c}$. A center of conductive feature layout pattern 404 is separated from cut feature layout pattern 1006 in the second direction Y by a distance $D_{5b}$. A center of conductive feature layout pattern 406 is separated from cut feature layout pattern 1008 in the second direction Y by a distance $D_{5a}$.

In some embodiments, at least one of length $L_{2a}$, length $L_{2b}$, length $L_{2c}$, length $L_{2d}$, length $L_{2e}$, length $L_3$, length $L_4$, length $L_5$, length $L_{5a}$, length $L_{5b}$, length $L_{5c}$, length $L_{5d}$, length $L_{5e}$, length $L_{5f}$, width $W_{1a}$, width $W_{1a'}$, width $W_{1b}$, width $W_{1c}$, width $W_{1d}$, width $W_{1e}$, width $W_2$, width $W_3$, width $W_{4a}$, width $W_{4b}$, width $W_{4c}$, width $W_{4d}$, distance $D_{1a}$, distance $D_{1b}$, distance $D_{2a}$, distance $D_{2b}$, distance $D_{3a}$, distance Dab distance $D_{4a}$, distance $D_{4b}$, distance $D_{4c}$, distance $D_{4d}$, distance $D_{5a}$, distance $D_{5b}$, distance $D_{5c}$, distance $D_{5d}$, pitch P1, pitch $P_{2a}$, pitch $P_{2b}$, or pitch P3 is equal to at least one of length $L_{2a}$, length $L_{2b}$, length $L_{2c}$, length $L_{2d}$, length $L_{2e}$, length $L_3$, length $L_4$, length $L_5$, length $L_{5a}$, length $L_{5b}$, length $L_{5c}$, length $L_{5d}$, length $L_{5e}$, length $L_{5f}$, width $W_{1a}$, width $W_{1a'}$, width $W_{1b}$, width $W_{1c}$, width $W_{1d}$, width $W_{1e}$, width $W_2$, width $W_3$, width $W_{4a}$, width $W_{4b}$, width $W_{4c}$, width $W_{4d}$, distance $D_{1a}$, distance $D_{1b}$, distance $D_{2a}$, distance $D_{2b}$, distance $D_{3a}$, distance $D_{3b}$ distance $D_{4a}$, distance $D_{4b}$, distance $D_{4c}$, distance $D_{4d}$, distance $D_{5a}$, distance $D_{5b}$, distance $D_{5c}$, distance $D_{5d}$, pitch P1, pitch $P_{2a}$, pitch $P_{2b}$, or pitch P3.

In some embodiments, at least one of length $L_{2a}$, length $L_{2b}$, length $L_{2c}$, length $L_{2d}$, length $L_{2e}$, length $L_3$, length $L_4$, length $L_5$, length $L_{5a}$, length $L_{5b}$, length $L_{5c}$, length $L_{5d}$, length $L_{5e}$, length $L_{5f}$, width $W_{1a}$, width $W_{1a'}$, width $W_{1b}$, width $W_{1c}$, width $W_{1d}$, width $W_{1e}$, width $W_2$, width $W_3$, width $W_{4a}$, width $W_{4b}$, width $W_{4c}$, width $W_{4d}$, distance $D_{1a}$, distance $D_{1b}$, distance $D_{2a}$, distance $D_{2b}$, distance $D_{3a}$, distance $D_{3b}$, distance $D_{4a}$, distance $D_{4b}$, distance $D_{4c}$, distance $D_{4d}$, distance $D_{5a}$, distance $D_{5b}$, distance $D_{5c}$, distance $D_{5d}$, pitch P1, pitch $P_{2a}$, pitch $P_{2b}$, or pitch $P_3$ is greater than at least one of length $L_{2a}$, length $L_{2b}$, length $L_{2c}$, length $L_{2d}$, length $L_{2e}$, length $L_3$, length $L_4$, length $L_5$, length $L_{5a}$, length $L_{5b}$, length $L_{5c}$, length $L_{5d}$, length $L_{5e}$, length $L_{5f}$, width $W_{1a}$, width $W_{1a'}$, width $W_{1b}$, width $W_{1c}$, width $W_{1d}$, width $W_{1e}$, width $W_2$, width $W_3$, width $W_{4a}$, width $W_{4b}$, width $W_{4c}$, width $W_{4d}$, distance $D_{1a}$, distance $D_{1b}$, distance $D_{2a}$, distance $D_{2b}$, distance $D_{3a}$, distance $D_{3b}$ distance $D_{4a}$, distance $D_{4b}$, distance $D_{4c}$, distance $D_{4d}$, distance $D_{5a}$, distance $D_{5b}$, distance $D_{5c}$, distance $D_{5d}$, pitch P1, pitch $P_{2a}$, pitch $P_{2b}$, or pitch $P_3$.

In some embodiments, at least one of length $L_{2a}$, length $L_{2b}$, length $L_{2c}$, length $L_{2d}$, length $L_{2e}$, length $L_3$, length $L_4$, length $L_5$, length $L_{5a}$, length $L_{5b}$, length $L_{5c}$, length $L_{5d}$, length $L_{5e}$, length $L_{5f}$, width $W_{1a}$, width $W_{1a'}$, width $W_{1b}$, width $W_{1c}$, width $W_{1a}$, width $W_{1e}$, width $W_2$, width $W_3$, width $W_{4a}$, width $W_{4b}$, width $W_{4c}$, width $W_{4d}$, distance $D_{1a}$, distance $D_{1b}$, distance $D_{2a}$, distance $D_{2b}$, distance $D_{3a}$, distance $D_{3b}$, distance $D_{4a}$, distance $D_{4b}$, distance $D_{4c}$, distance $D_{4d}$, distance $D_{5a}$, distance $D_{5b}$, distance $D_{5c}$, distance $D_{5d}$, pitch P1, pitch $P_{2a}$, pitch $P_{2b}$, or pitch $P_3$ is less than at least one of length $L_{2a}$, length $L_{2b}$, length $L_{2c}$, length $L_{2d}$, length $L_{2e}$, length $L_3$, length $L_4$, length $L_5$, length $L_{5a}$, length $L_5b$, length $L_5e$, length $L_{5d}$, length $L_{5e}$, length $L_{5f}$, width $W_{1a}$, width $W_{1a'}$, width $W_{1b}$, width $W_{1c}$, width $W_{1d}$, width $W_{1e}$, width $W_2$, width $W_3$, width $W_{4a}$, width $W_{4b}$, width $W_{4c}$, width $W_{4d}$, distance $D_{1a}$, distance $D_{1b}$, distance $D_{2a}$, distance $D_{2b}$, distance $D_{3a}$, distance $D_{3b}$ distance $D_{4a}$, distance $D_{4b}$, distance $D_{4c}$, distance $D_{4d}$, distance $D_{5a}$, distance $D_{5b}$, distance $D_{5c}$, distance $D_{5d}$, pitch P1, pitch $P_{2a}$, pitch $P_{2b}$, or pitch $P_3$.

Components that are the same or similar to those in each of FIGS. 1, 2A-2B, 3A-3B, 4, 5A-5B, 6A-6B, 7-11 are given the same reference numbers, and detailed description thereof is thus omitted. Layout design 300, 300', 400, 500, 500', 600, 700, 800, 900, 1000 or 1100 depicts overlapping layout patterns from various layout layers. Some layout patterns and some layout layers of layout design 300, 300', 400, 500, 500', 600, 700, 800, 900, 1000 or 1100 are simplified or omitted. In some embodiments, layout design 700, 800, 900, 1000 or 1100 is usable to form a power structure with features similar to that shown by the corresponding layout design 700, 800, 900, 1000 or 1100. In these embodiments, the power structure is configured to be combined with a standard cell in an integrated circuit.

FIG. 12 is a schematic view of a system 1200 for designing an integrated circuit in accordance with some embodiments. System 1200 includes a hardware processor 1202 and a non-transitory, computer readable storage medium 1204 encoded with, i.e., storing, the computer program code 1206, i.e., a set of executable instructions. The computer program code 1206 is configured to interface with manufacturing machines for producing the integrated circuit. The processor 1202 is electrically coupled to the computer readable storage medium 1204 via a bus 1208. The processor 1202 is also electrically coupled to an I/O interface 1210 by bus 1208. A network interface 1212 is also electrically connected to the processor 1202 via bus 1208. Network interface 1212 is connected to a network 1214, so that processor 1202 and computer readable storage medium 1204 are capable of connecting to external elements via network 1214. The processor 1202 is configured to execute the computer program code 1206 encoded in the computer readable storage medium 1204 in order to cause system 1200 to be usable for performing a portion or all of the operations as described in method 200 or method 200'.

In some embodiments, the processor 1202 is a central processing unit (CPU), a multi-processor, a distributed processing system, an application specific integrated circuit (ASIC), and/or a suitable processing unit. In some embodiments, the processor 1202 is a processing device configured to execute instructions to cause the processing device to perform a specific operation or set of operations of method 200 or 200'.

In some embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1204 includes a compact disk-read only memory (CD-ROM), a compact disk-read/write (CD-R/W), and/or a digital video disc (DVD).

In some embodiments, the storage medium 1204 stores the computer program code 1206 configured to cause system 1200 to perform method 200 or method 200'. In some embodiments, the storage medium 1204 also stores information needed for performing a method 200 or 200' as well as information generated during performing the method 200 or 200', such as layout design 1216, standard cell library 1218, at least one design criterion 1220, standard cell layout pattern 1222, power layout pattern 1224, power layout library 1226, and user interface 1228, and/or a set of executable instructions to perform the operation of method 200 or 200'.

In some embodiments, the storage medium 1204 stores the computer program code 1206 for interfacing with manufacturing machines. The computer program code 1206 enable processor 1202 to generate manufacturing instructions readable by the manufacturing machines to effectively implement method 200 or method 200' during a manufacturing process.

System 1200 includes I/O interface 1210. I/O interface 1210 is coupled to external circuitry. In some embodiments, I/O interface 1210 includes a keyboard, keypad, mouse, trackball, trackpad, and/or cursor direction keys for communicating information and commands to processor 1202.

System 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interface such as ETHERNET, USB, or IEEE-1394. In some embodiments, method 200 or 200' is implemented in two or more systems 1200, and information such as layout design, standard cell library, at least one design criterion, standard cell layout pattern, power layout pattern, power layout library and user interface are exchanged between different systems 1200 by network 1214.

System 1200 is configured to receive information related to a layout design through I/O interface 1210 or network interface 1212. The information is transferred to processor 1202 via bus 1208 to determine a layout design for producing integrated circuit 100. The layout design is then stored in computer readable medium 1204 as layout design 1216. System 1200 is configured to receive information related to standard cell library through I/O interface 1210 or network interface 1212. The information is stored in computer readable medium 1204 as standard cell library 1218. System 1200 is configured to receive information related to at least one design criterion through I/O interface 1210 or network interface 1212. The information is stored in computer readable medium 1204 as at least one design criterion 1220. System 1200 is configured to receive information related to a standard cell layout pattern through I/O interface 1210 or network interface 1212. The information is stored in computer readable medium 1204 as standard cell layout pattern 1222. System 1200 is configured to receive information related to a power layout pattern through I/O interface 1210 or network interface 1212. The information is stored in computer medium 1204 as power layout pattern 1224. System 1200 is configured to receive information related to a power layout library through I/O interface 1210 or network interface 1212. The information is stored in computer readable medium 1204 as power layout library 1226. System 1200 is configured to receive information related to a user interface through I/O interface 1210 or network interface 1212. The information is stored in computer readable medium 1204 as user interface 1228.

In some embodiments, method 200 or 200' is implemented as a standalone software application for execution by a processor. In some embodiments, method 200 or 200' is implemented as a software application that is a part of an additional software application. In some embodiments, method 200 or 200' is implemented as a plug-in to a software application. In some embodiments, method 200 or 200' is implemented as a software application that is a portion of an EDA tool. In some embodiments, method 200 or 200' is implemented as a software application that is used by an EDA tool. In some embodiments, the EDA tool is used to generate a layout of the semiconductor device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design.

System 1200 of FIG. 12 generates layout designs (e.g., layout design 400, 500, 500', 700, 800, 900, 1000, 1100) of integrated circuit 100 that occupy less area than other approaches. In some embodiments, system 1200 of FIG. 12 generates conductive feature layout patterns 402, 306' & 504 that are spaced closer to each other than other approaches. In some embodiments, conductive feature layout patterns 402, 306' & 504 are utilized to manufacture corresponding conductive structures in an integrated circuit (e.g., integrated circuit 100) that are spaced closer to each other and provide additional via access points than other approaches.

One aspect of this description relates to an integrated circuit. The integrated circuit includes a first region. The integrated circuit further includes a first conductive structure in the first region, wherein the first conductive structure extends in a first direction. The integrated circuit further includes a first via coupled to the first conductive structure. The integrated circuit further includes a second region adjacent to the first region. The integrated circuit further includes a power structure configured to supply a voltage to the first region or the second region. The power structure includes a second conductive structure extending in the first direction and overlapping a boundary between the first region and the second region. The first conductive structure and the second conductive structure are aligned in a second direction different than the first direction. The first conductive structure and the second conductive structure are separated from each other in the first direction by a distance greater than a minimum spacing requirement of the first conductive structure and the second conductive structure. In some embodiments, the power structure further includes a third conductive structure extending in the second direction; and a second via between the second conductive structure and the third conductive structure. In some embodiments, the power structure further includes a fourth conductive structure extending in the second direction; and a third via between the second conductive structure and the fourth conductive structure. In some embodiments, the power structure further includes a fourth conductive structure extending in the first direction; and a third via between the third conductive structure and the fourth conductive structure. In some embodiments, a first distance from the first conductive structure to a substrate is equal to a second distance from the second conductive structure to the substrate. In some embodiments, a first distance from the first conductive structure to a substrate is different from a second distance from the second conductive structure to the substrate. In some embodiments, the integrated circuit further includes a third conductive structure in the first region, wherein the third conductive structure extends in the first direction, and an end of the third conductive structure is closer to the boundary than an end of the first conductive structure. In some embodiments, the integrated circuit further includes a third conductive structure over the second conductive structure, wherein the third conductive structure extends in the second direction; and a fourth conductive structure over the second conductive structure, wherein the fourth conductive structure extends in the second direction, and the fourth conductive structure is spaced from the third conductive structure in the first direction. In some embodiments, the third conductive structure is in the first region, and the second conductive structure is in the second region. In some embodiments, the first region is a first memory cell or a first logic gate cell. In some embodiments, the second region is a second memory cell, different from the first memory cell, or a second logic gate cell, different from the first logic gate cell. In some embodiments, One aspect of this description relates to an integrated circuit. The integrated circuit includes a first region, wherein the first region is a first memory cell or a first logic gate cell. The integrated circuit further includes a second region, wherein the second region is a second memory cell or a second logic gate cell. The integrated circuit further includes a first conductive structure in the first region, wherein the first conductive structure extends in a first direction. The integrated circuit further includes a power structure configured to supply a voltage to the first region and the second region. The power structure includes a second conductive structure extending in the first direction and overlapping a boundary between the first region and the second region. The first conductive structure and the second conductive structure are aligned in a second direction perpendicular to the first direction. The first conductive structure and the second conductive structure are separated from each other in the first direction by a distance greater than a minimum spacing requirement of the first conductive structure and the second conductive structure. In some embodiments, the first region is the first memory cell, the second region is the second memory cell, and the first memory cell is equivalent to the second memory cell. In some embodiments, the first region is the first logic gate cell, the second region is the second logic gate cell, and the first logic gate cell is different from the second logic gate cell. In some embodiments, the first region abuts the second region. In some embodiments, the first region is spaced from the second region in the first direction. In some embodiments, the integrated circuit further includes a third conductive feature over the second conductive feature, wherein the third conductive feature extends in the second direction; and a via between the third conductive feature and the second conductive feature. In some embodiments, a dimension of the via in the second direction is equal to a dimension of the second conductive feature in the second direction. In some embodiments, a dimension of the via in the first direction is equal to a dimension of the third conductive feature in the first direction.

One aspect of this description relates to an integrated circuit. The integrated circuit includes a first region, wherein the first region is a first memory cell or a first logic gate cell. The integrated circuit further includes a second region, wherein the second region is a second memory cell or a second logic gate cell. The integrated circuit further includes a first conductive structure in the first region, wherein the first conductive structure extends in a first direction. The integrated circuit further includes a power structure configured to supply a voltage to the first region and the second region. The power structure includes a second conductive structure extending in the first direction and overlapping a boundary between the first region and the second region, the first conductive structure and the second conductive structure are aligned in a second direction perpendicular to the first direction, and the first conductive structure and the second conductive structure are separated from each other in the first direction by a distance greater than a minimum spacing requirement of the first conductive structure and the second conductive structure. The power structure further includes a third conductive structure over the second conductive structure, wherein the third conductive structure extends in the second direction, and the third conductive structure is in the first region. The power structure further includes a fourth conductive structure over the second conductive structure, wherein the fourth conductive structure extends in the second direction, and the fourth conductive structure is in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first region;
   a first conductive structure in the first region, wherein the first conductive structure extends in a first direction;
   a first via coupled to the first conductive structure;
   a second region adjacent to the first region; and
   a power structure configured to supply a voltage to the first region or the second region, wherein the power structure comprises a second conductive structure extending in the first direction and overlapping a boundary between the first region and the second region, the first conductive structure and the second conductive structure are aligned in a second direction different than the first direction, and the first conductive structure and the second conductive structure are separated from each other in the first direction by a distance greater than a minimum spacing requirement of the first conductive structure and the second conductive structure.

2. The integrated circuit of claim 1, wherein the power structure further comprises:
   a third conductive structure extending in the second direction; and
   a second via between the second conductive structure and the third conductive structure.

3. The integrated circuit of claim 2, wherein the power structure further comprises:
   a fourth conductive structure extending in the second direction; and
   a third via between the second conductive structure and the fourth conductive structure.

4. The integrated circuit of claim 2, wherein the power structure further comprises:
   a fourth conductive structure extending in the first direction; and
   a third via between the third conductive structure and the fourth conductive structure.

5. The integrated circuit of claim 1, wherein a first distance from the first conductive structure to a substrate is equal to a second distance from the second conductive structure to the substrate.

6. The integrated circuit of claim 1, wherein a first distance from the first conductive structure to a substrate is different from a second distance from the second conductive structure to the substrate.

7. The integrated circuit of claim 1, further comprising a third conductive structure in the first region, wherein the third conductive structure extends in the first direction, and an end of the third conductive structure is closer to the boundary than an end of the first conductive structure.

8. The integrated circuit of claim 1, further comprising:
   a third conductive structure over the second conductive structure, wherein the third conductive structure extends in the second direction; and
   a fourth conductive structure over the second conductive structure, wherein the fourth conductive structure extends in the second direction, and the fourth conductive structure is spaced from the third conductive structure in the first direction.

9. The integrated circuit of claim 8, wherein the third conductive structure is in the first region, and the second conductive structure is in the second region.

10. The integrated circuit of claim 1, wherein the first region is a first memory cell or a first logic gate cell.

11. The integrated circuit of claim 10, wherein the second region is a second memory cell, different from the first memory cell, or a second logic gate cell, different from the first logic gate cell.

12. An integrated circuit comprising:
   a first region, wherein the first region is a first memory cell or a first logic gate cell;
   a second region, wherein the second region is a second memory cell or a second logic gate cell;
   a first conductive structure in the first region, wherein the first conductive structure extends in a first direction; and a power structure configured to supply a voltage to the first region and the second region, wherein the power structure comprises a second conductive structure extending in the first direction and overlapping a boundary between the first region and the second region, the first conductive structure and the second conductive structure are aligned in a second direction perpendicular to the first direction, and the first conductive structure and the second conductive structure are separated from each other in the first direction by a distance greater than a minimum spacing requirement of the first conductive structure and the second conductive structure.

13. The integrated circuit of claim 12, wherein the first region is the first memory cell, the second region is the second memory cell, and the first memory cell is equivalent to the second memory cell.

14. The integrated circuit of claim 12, wherein the first region is the first logic gate cell, the second region is the second logic gate cell, and the first logic gate cell is different from the second logic gate cell.

15. The integrated circuit of claim 12, wherein the first region abuts the second region.

16. The integrated circuit of claim 12, wherein the first region is spaced from the second region in the first direction.

17. The integrated circuit of claim 12, further comprising:
a third conductive feature over the second conductive feature, wherein the third conductive feature extends in the second direction; and
a via between the third conductive feature and the second conductive feature.

18. The integrated circuit of claim 17, wherein a dimension of the via in the second direction is equal to a dimension of the second conductive feature in the second direction.

19. The integrated circuit of claim 17, wherein a dimension of the via in the first direction is equal to a dimension of the third conductive feature in the first direction.

20. An integrated circuit comprising:
a first region, wherein the first region is a first memory cell or a first logic gate cell;
a second region, wherein the second region is a second memory cell or a second logic gate cell;
a first conductive structure in the first region, wherein the first conductive structure extends in a first direction; and
a power structure configured to supply a voltage to the first region and the second region, wherein the power structure comprises:
a second conductive structure extending in the first direction and overlapping a boundary between the first region and the second region, the first conductive structure and the second conductive structure are aligned in a second direction perpendicular to the first direction, and the first conductive structure and the second conductive structure are separated from each other in the first direction by a distance greater than a minimum spacing requirement of the first conductive structure and the second conductive structure,
a third conductive structure over the second conductive structure, wherein the third conductive structure extends in the second direction, and the third conductive structure is in the first region, and
a fourth conductive structure over the second conductive structure, wherein the fourth conductive structure extends in the second direction, and the fourth conductive structure is in the second region.

* * * * *